(12) United States Patent
Boysel et al.

(10) Patent No.: US 12,704,427 B2
(45) Date of Patent: Aug. 11, 2026

(54) MEMS PRESSURE SENSOR

(71) Applicant: MEI Micro, Inc., Orlando, FL (US)

(72) Inventors: Robert Mark Boysel, Delaware, OH (US); Louis Ross, Tokyo (JP)

(73) Assignee: MEI Micro, Inc., Orlando, FL (US)

( * ) Notice: Subject to any disclaimer, the term of this patent is extended or adjusted under 35 U.S.C. 154(b) by 0 days.

(21) Appl. No.: 18/109,127

(22) Filed: Feb. 13, 2023

(65) Prior Publication Data

US 2023/0417614 A1 Dec. 28, 2023

Related U.S. Application Data

(63) Continuation of application No. 17/012,896, filed on Sep. 4, 2020, now Pat. No. 11,579,033, which is a (Continued)

(51) Int. Cl.
*G01L 9/00* (2006.01)
*B81B 7/00* (2006.01)
(Continued)

(52) U.S. Cl.
CPC ............ *G01L 9/0073* (2013.01); *B81B 7/007* (2013.01); *B81C 1/00182* (2013.01); (Continued)

(58) Field of Classification Search
None
See application file for complete search history.

(56) References Cited

U.S. PATENT DOCUMENTS 4,430,895 A 2/1984 Colton
4,483,194 A 11/1984 Rudolf
(Continued)

FOREIGN PATENT DOCUMENTS

CN 103350983 A 10/2013
EP 1802952 A1 7/2007
(Continued)

OTHER PUBLICATIONS

Boysel et al., Development of a Single-Mass Five-Axis MEMS Motion Sensor. Virtus Advanced Sensors, Inc., 17 pages. (May 2009).

(Continued)

*Primary Examiner* — Nilufa Rahim
(74) *Attorney, Agent, or Firm* — McCarter & English, LLP

(57) ABSTRACT

The present invention provides a MEMS pressure sensor and a manufacturing method. The pressure is formed by a top cap wafer, a MEMS wafer and a bottom cap wafer. The MEMS wafer comprises a frame and a membrane, the frame defining a cavity. The membrane is suspended by the frame over the cavity. The bottom cap wafer closes the cavity. The top cap wafer has a recess defining with the membrane a capacitance gap. The top cap wafer comprises a top cap electrode located over the membrane and forming, together with the membrane, a capacitor to detect a deflection of the membrane. Electrical contacts on the top cap wafer are connected to the top cap electrode. A vent extends from outside of the sensor into the cavity or the capacitance gap. The pressure sensor can include two cavities and two capacitance gaps to form a differential pressure sensor.

31 Claims, 16 Drawing Sheets

Related U.S. Application Data continuation of application No. 16/694,607, filed on Nov. 25, 2019, now Pat. No. 10,768,065, which is a continuation of application No. 15/302,731, filed as application No. PCT/CA2015/050026 on Jan. 15, 2015, now abandoned.

(60) Provisional application No. 61/977,776, filed on Apr. 10, 2014.

(51) Int. Cl.
*B81C 1/00* (2006.01)
*G01L 13/02* (2006.01)

(52) U.S. Cl.
CPC ........ *B81C 1/00301* (2013.01); *G01L 13/025* (2013.01); *B81B 2201/0264* (2013.01); *B81B 2203/0127* (2013.01); *B81B 2207/012* (2013.01); *B81B 2207/015* (2013.01); *B81B 2207/07* (2013.01); *B81B 2207/095* (2013.01); *B81C 2203/0109* (2013.01); *B81C 2203/0792* (2013.01)

(56) References Cited

U.S. PATENT DOCUMENTS 4,553,436 A 11/1985 Hansson
4,590,801 A 5/1986 Merhav
4,592,233 A 6/1986 Peters
4,805,456 A 2/1989 Howe et al.
4,833,417 A 5/1989 Schroeder
4,881,408 A 11/1989 Hulsing, II et al.
4,882,933 A 11/1989 Petersen et al.
4,905,523 A 3/1990 Okada
4,967,605 A 11/1990 Okada
5,177,661 A 1/1993 Zavracky et al.
5,235,457 A 8/1993 Lichtman et al.
5,239,984 A 8/1993 Cane et al.
5,359,893 A 11/1994 Dunn
5,557,046 A 9/1996 Hulsing, II
5,596,144 A 1/1997 Swanson
5,608,210 A 3/1997 Esparza et al.
5,614,742 A 3/1997 Gessner et al.
5,623,270 A 4/1997 Kempkes et al.
5,635,639 A 6/1997 Greiff et al.
5,646,346 A 7/1997 Okada
5,662,111 A 9/1997 Cosman
5,777,226 A 7/1998 Ip
5,831,163 A 11/1998 Okada
5,894,090 A 4/1999 Tang et al.
5,895,850 A 4/1999 Buestgens
5,898,223 A 4/1999 Frye et al.
5,920,011 A 7/1999 Hulsing, II
5,959,206 A 9/1999 Ryrko et al.
5,962,784 A 10/1999 Hulsing, II
5,977,640 A 11/1999 Bertin et al.
5,987,985 A 11/1999 Okada
5,992,233 A 11/1999 Clark
6,003,371 A 12/1999 Okada
6,028,773 A 2/2000 Hundt
6,053,057 A 4/2000 Okada
6,058,778 A 5/2000 Chan et al.
6,079,272 A 6/2000 Stell et al.
6,089,088 A 7/2000 Charvet
6,090,638 A 7/2000 Vigna et al.
6,091,132 A 7/2000 Bryant
6,119,517 A 9/2000 Breng et al.
6,122,961 A 9/2000 Geen et al.
6,159,773 A 12/2000 Lin
6,184,052 B1 2/2001 Vigna et al.
6,225,699 B1 5/2001 Ference et al.
6,235,550 B1 5/2001 Chan et al.
6,257,057 B1 7/2001 Hulsing, II
6,257,059 B1 7/2001 Weinberg et al.
6,282,956 B1 9/2001 Okada
6,295,870 B1 10/2001 Hulsing, II
6,391,673 B1 5/2002 Ha et al.
6,399,997 B1 6/2002 Lin et al.
6,469,330 B1 10/2002 Vigna et al.
6,487,000 B2 11/2002 Mastromatteo et al.
6,490,923 B1 12/2002 Breng et al.
6,508,124 B1 1/2003 Zerbini et al.
6,539,801 B1 4/2003 Gutierrez et al.
6,584,845 B1 7/2003 Gutierrez et al.
6,587,312 B2 7/2003 Murari et al.
6,621,137 B1 9/2003 Ma et al.
6,651,500 B2 11/2003 Stewart et al.
6,675,630 B2 1/2004 Challoner et al.
6,696,364 B2 2/2004 Gelmi et al.
6,701,786 B2 3/2004 Hulsing, II
6,705,167 B2 3/2004 Kvisteroey et al.
6,715,353 B2 4/2004 Johnson
6,718,823 B2 4/2004 Platt
6,766,689 B2 7/2004 Durante et al.
6,772,632 B2 8/2004 Okada
6,808,952 B1 10/2004 Sniegowski et al.
6,808,955 B2 10/2004 Ma
6,829,937 B2 12/2004 Mahon
6,841,861 B2 1/2005 Brady
6,856,144 B2 2/2005 Lasalandra et al.
6,863,832 B1 3/2005 Wiemer et al.
6,865,943 B2 3/2005 Okada
6,892,575 B2 5/2005 Nasiri et al.
6,925,875 B2 8/2005 Silverbrook
6,928,879 B2 8/2005 Partridge et al.
6,936,491 B2 8/2005 Partridge et al.
6,939,473 B2 9/2005 Nasiri et al.
6,942,750 B2 9/2005 Chou et al.
6,944,931 B2 9/2005 Shcheglov et al.
6,953,985 B2 10/2005 Lin et al.
6,978,673 B2 12/2005 Johnson et al.
6,990,863 B2 1/2006 Challoner et al.
6,991,957 B2 1/2006 Eskridge
6,993,617 B2 1/2006 Butcher et al.
7,017,410 B2 3/2006 Challoner et al.
7,040,163 B2 5/2006 Shcheglov et al.
7,043,985 B2 5/2006 Ayazi et al.
7,056,757 B2 6/2006 Ayazi et al.
7,093,486 B2 8/2006 Challoner et al.
7,100,448 B2 9/2006 Ikegami
7,104,129 B2 9/2006 Nasiri et al.
7,138,694 B2 11/2006 Nunan et al.
7,159,441 B2 1/2007 Challoner et al.
7,160,752 B2 1/2007 Ouellet et al.
7,168,317 B2 1/2007 Chen et al.
7,168,318 B2 1/2007 Challoner et al.
7,176,556 B2 2/2007 Okamoto et al.
7,180,019 B1 2/2007 Chiou et al.
7,210,351 B2 5/2007 Lo et al.
7,217,588 B2 5/2007 Hartzell et al.
7,238,999 B2 7/2007 LaFond et al.
7,247,246 B2 7/2007 Nasiri et al.
7,250,112 B2 7/2007 Nasiri et al.
7,250,353 B2 7/2007 Nasiri et al.
7,258,008 B2 8/2007 Durante et al.
7,258,011 B2 8/2007 Nasiri et al.
7,258,012 B2 8/2007 Xie
7,275,424 B2 10/2007 Felton et al.
7,291,561 B2 11/2007 Ma et al.
7,318,349 B2 1/2008 Vaganov et al.
7,322,236 B2 1/2008 Combi et al.
7,322,237 B2 1/2008 Kutsuna
7,337,671 B2 3/2008 Ayazi et al.
7,347,095 B2 3/2008 Shcheglov et al.
7,360,423 B2 4/2008 Ayazi et al.
7,402,905 B2 7/2008 Eskridge et al.
7,417,329 B2 8/2008 Chuang et al.
7,442,570 B2 10/2008 Nasiri et al.
7,458,263 B2 12/2008 Nasiri et al.
7,484,410 B2 2/2009 Tsuji et al.
7,491,567 B2 2/2009 DCamp et al.
7,518,493 B2 4/2009 Bryzek et al.
7,541,588 B2 6/2009 Tabirian et al.

(56) References Cited

U.S. PATENT DOCUMENTS 7,543,496 B2 6/2009 Ayazi et al.
7,578,189 B1 8/2009 Mehregany
7,615,406 B2 11/2009 Higashi et al.
7,617,729 B2 11/2009 Axelrod et al.
7,621,183 B2 11/2009 Seeger et al.
7,624,494 B2 12/2009 Challoner et al.
7,642,115 B2 1/2010 Eriksen et al.
7,642,657 B2 1/2010 Suilleabhain et al.
7,677,099 B2 3/2010 Nasiri et al.
7,684,101 B2 3/2010 Border et al.
7,689,321 B2 3/2010 Karlsson
7,690,254 B2 4/2010 Pilchowski et al.
7,694,563 B2 4/2010 Durante et al.
7,748,272 B2 7/2010 Kranz et al.
7,755,367 B2 7/2010 Schoen et al.
7,767,483 B1 8/2010 Waters
7,784,344 B2 8/2010 Pavelescu et al.
7,786,572 B2 8/2010 Chen
7,790,608 B2 9/2010 Lauxtermann et al.
7,795,723 B2 9/2010 Chau et al.
7,810,379 B2 10/2010 DeNatale et al.
7,851,898 B2 12/2010 Nakamura et al.
7,863,698 B2 1/2011 Seeger et al.
7,875,942 B2 1/2011 Cortese et al.
7,882,740 B2 2/2011 Okada
7,886,601 B2 2/2011 Merassi et al.
7,898,043 B2 3/2011 Ziglioli et al.
7,908,921 B2 3/2011 Binda et al.
7,928,632 B2 4/2011 Yang et al.
7,929,143 B2 4/2011 Wilfinger et al.
7,934,423 B2 5/2011 Nasiri et al.
7,964,428 B2 6/2011 Breng et al.
7,971,483 B2 7/2011 Supino et al.
7,982,291 B2 7/2011 Kuisma
7,982,558 B2 7/2011 Sworowski et al.
7,987,714 B2 8/2011 DeNatale et al.
8,042,394 B2 10/2011 Coronato et al.
8,047,075 B2 11/2011 Nasiri et al.
8,049,515 B2 11/2011 Schoen et al.
8,069,726 B2 12/2011 Seeger et al.
8,071,398 B1 12/2011 Yang et al.
8,077,372 B2 12/2011 Border et al.
8,080,869 B2 12/2011 Okudo et al.
8,084,332 B2 12/2011 Nasiri et al.
8,100,012 B2 1/2012 Martin et al.
8,124,895 B2 2/2012 Merassi et al.
8,134,214 B2 3/2012 Baldo et al.
8,151,640 B1 4/2012 Kubena
8,166,816 B2 5/2012 Ayazi et al.
8,176,782 B2 5/2012 Furukubo et al.
8,186,221 B2 5/2012 Lin et al.
8,220,328 B2 7/2012 Rudolf et al.
8,227,285 B1 7/2012 Yang et al.
8,227,911 B1 7/2012 Yang et al.
8,230,740 B2 7/2012 Katsuki et al.
8,236,577 B1 8/2012 Hsu et al.
8,250,921 B2 8/2012 Nasiri et al.
8,258,590 B2 9/2012 Geiger et al.
8,272,266 B2 9/2012 Zhang et al.
8,283,737 B2 10/2012 Sugizaki
8,289,092 B2 10/2012 Pomarico et al.
8,297,121 B2 10/2012 Quer et al.
8,314,483 B2 11/2012 Lin et al.
8,324,047 B1 12/2012 Yang
8,347,717 B2 1/2013 Seeger et al.
8,350,346 B1 1/2013 Huang et al.
8,365,595 B2 2/2013 Geiger et al.
8,368,153 B2 2/2013 Huang et al.
8,372,677 B2 2/2013 Mehregany
8,375,789 B2 2/2013 Prandi et al.
8,384,134 B2 2/2013 Daneman et al.
8,390,173 B2 3/2013 Yoshihara et al.
8,395,252 B1 3/2013 Yang
8,395,381 B2 3/2013 Lo et al.
8,402,666 B1 3/2013 Hsu et al.
8,405,170 B2 3/2013 Kohl et al.
8,407,905 B1 4/2013 Hsu et al.
8,413,506 B2 4/2013 Coronato et al.
8,421,082 B1 4/2013 Yang
8,426,961 B2 4/2013 Shih et al.
8,432,005 B2 4/2013 Yang et al.
8,433,084 B2 4/2013 Conti et al.
8,445,307 B2 5/2013 Yeh et al.
8,459,093 B2 6/2013 Donadel et al.
8,459,110 B2 6/2013 Cazzaniga et al.
8,461,656 B2 * 6/2013 Park .................... G01P 15/125 257/419
8,461,935 B2 6/2013 McCraith et al.
8,481,365 B2 7/2013 Verhelijden et al.
8,486,744 B2 7/2013 Lin et al.
8,487,444 B2 7/2013 Law et al.
8,490,461 B2 7/2013 Sasaki et al.
8,490,483 B2 7/2013 Wrede et al.
8,497,557 B2 7/2013 Tanaka et al.
8,508,039 B1 8/2013 Nasiri et al.
8,508,045 B2 8/2013 Khan et al.
8,513,747 B1 8/2013 Huang et al.
8,519,537 B2 8/2013 Jeng et al.
8,567,246 B2 10/2013 Shaeffer et al.
8,569,090 B2 10/2013 Taheri
8,587,077 B2 11/2013 Chen
8,593,036 B2 11/2013 Boysel
8,614,110 B1 12/2013 Waters et al.
8,637,943 B1 1/2014 Yang
8,652,961 B1 2/2014 Yang
8,671,756 B2 3/2014 Comi et al.
8,675,181 B2 3/2014 Hall
8,685,776 B2 4/2014 LaFond et al.
8,704,238 B2 4/2014 Yang et al.
8,748,206 B2 6/2014 Horning
8,759,926 B2 6/2014 Fujii et al.
8,810,030 B2 8/2014 Geisberger
8,826,514 B2 9/2014 Papavasiliou et al.
8,869,616 B1 10/2014 Sridharamurthy et al.
8,885,170 B2 11/2014 Kilic et al.
8,919,199 B2 12/2014 Judy et al.
8,921,145 B2 12/2014 Shu et al.
RE45,439 E 3/2015 Prandi et al.
8,997,564 B2 4/2015 Nasiri et al.
9,010,184 B2 4/2015 Zou et al.
9,013,233 B2 4/2015 Elmallah et al.
9,046,541 B1 6/2015 Kubena et al.
9,061,891 B2 6/2015 Supino et al.
9,063,549 B1 6/2015 Pennecot et al.
9,085,455 B2 7/2015 Cheng et al.
9,130,531 B1 * 9/2015 Cheng .................. B81B 3/0081
9,309,106 B2 4/2016 Boysel et al.
9,340,414 B2 5/2016 Yoneoka et al.
9,409,768 B2 8/2016 DeNatale et al.
9,499,397 B2 11/2016 Bowles et al.
9,567,204 B2 2/2017 Hung et al.
9,594,128 B2 3/2017 Farghaly et al.
9,709,595 B2 7/2017 Vohra et al.
9,751,754 B2 9/2017 Kurashima et al.
9,784,835 B1 10/2017 Droz et al.
9,837,935 B2 12/2017 Johnson et al.
9,869,754 B1 1/2018 Campbell et al.
9,945,950 B2 4/2018 Newman et al.
9,981,841 B2 5/2018 Chu et al.
10,214,414 B2 2/2019 Boysel et al.
10,273,147 B2 4/2019 Boysel
10,288,427 B2 5/2019 Nasiri et al.
10,392,244 B2 8/2019 Hung et al.
10,407,299 B2 9/2019 Boysel
11,287,486 B2 3/2022 Boysel
11,674,803 B2 6/2023 Boysel et al.
11,852,481 B2 12/2023 Boysel et al.
2001/0011994 A1 8/2001 Morimoto et al.
2002/0040602 A1 4/2002 Okada
2003/0094046 A1 5/2003 Okada
2003/0209075 A1 11/2003 Okada
2004/0016995 A1 1/2004 Kuo et al.
2004/0052016 A1 3/2004 Takagi et al.
2004/0063239 A1 4/2004 Yun et al.

(56) References Cited

U.S. PATENT DOCUMENTS

2004/0211258 A1 10/2004 Geen
2004/0224279 A1 11/2004 Siemons
2004/0231422 A1 11/2004 Okada
2005/0024527 A1 2/2005 Chiou
2005/0076719 A1 4/2005 Jakobsen et al.
2005/0166677 A1 8/2005 Nasiri et al.
2005/0210981 A1 9/2005 Okada
2005/0242991 A1 11/2005 Montgomery et al.
2005/0252308 A1 11/2005 Hjelt et al.
2006/0163453 A1 7/2006 Hynes et al.
2006/0163679 A1 7/2006 LaFond et al.
2006/0179941 A1 8/2006 Okada
2006/0180896 A1 8/2006 Martin et al.
2006/0185428 A1 8/2006 Combi et al.
2006/0208326 A1 9/2006 Nasiri et al.
2006/0231521 A1 10/2006 Chilcott
2006/0266118 A1 11/2006 Denison et al.
2007/0029629 A1 2/2007 Yazdi
2007/0125161 A1 6/2007 Bryzek et al.
2007/0180912 A1 8/2007 Judy et al.
2007/0214886 A1 9/2007 Sheynblat
2007/0273018 A1 11/2007 Onozuka et al.
2007/0279885 A1 12/2007 Basavanhally et al.
2007/0297631 A1 12/2007 Miles
2008/0098814 A1 5/2008 Platt et al.
2008/0283990 A1 11/2008 Nasiri et al.
2008/0289417 A1 11/2008 Okada
2008/0290490 A1 11/2008 Fujii et al.
2009/0114016 A1 5/2009 Nasiri et al.
2009/0199637 A1 8/2009 Sugiura et al.
2009/0255335 A1 10/2009 Fly et al.
2009/0272189 A1 11/2009 Acar et al.
2009/0297770 A1 12/2009 Yoshida et al.
2010/0072626 A1 3/2010 Theuss et al.
2010/0084752 A1 4/2010 Horning et al.
2010/0132460 A1 6/2010 Seeger et al.
2010/0164086 A1 7/2010 Noma et al.
2010/0176466 A1 7/2010 Fujii et al.
2010/0182418 A1 7/2010 Jess et al.
2010/0212425 A1 8/2010 Hsu et al.
2010/0218977 A1 9/2010 Inoue et al.
2010/0259130 A1 10/2010 Eckstein et al.
2010/0324366 A1 12/2010 Shimotsu
2011/0012248 A1 1/2011 Reichenbach et al.
2011/0016972 A1 1/2011 Reinert
2011/0030473 A1 2/2011 Acar
2011/0056293 A1 3/2011 Mori et al.
2011/0154898 A1 6/2011 Cazzaniga et al.
2011/0176196 A1* 7/2011 Govil .................. G02B 26/001 359/290
2011/0219876 A1 9/2011 Kalnitsky et al.
2011/0227173 A1 9/2011 Seppala et al.
2011/0228906 A1 9/2011 Jaffray et al.
2012/0006789 A1 1/2012 DeNatale et al.
2012/0032286 A1 2/2012 Trusov et al.
2012/0042731 A1 2/2012 Lin et al.
2012/0048017 A1 3/2012 Kempe
2012/0091854 A1 4/2012 Kaajakari
2012/0137774 A1 6/2012 Judy et al.
2012/0142144 A1 6/2012 Taheri
2012/0227487 A1 9/2012 Ayazi et al.
2012/0261822 A1 10/2012 Graham et al.
2012/0272734 A1 11/2012 Jeung et al.
2012/0280594 A1 11/2012 Chen et al.
2012/0291547 A1 11/2012 Kim et al.
2012/0300050 A1 11/2012 Korichi et al.
2012/0326248 A1 12/2012 Daneman et al.
2013/0009803 A1 1/2013 Edvardsson
2013/0019678 A1 1/2013 Lazaroff et al.
2013/0019680 A1 1/2013 Kittilsland et al.
2013/0031977 A1 2/2013 Kempe
2013/0100271 A1 4/2013 Howes
2013/0105921 A1 5/2013 Najafi et al.
2013/0115729 A1 5/2013 Silverbrook et al.
2013/0119492 A1 5/2013 Feiertag et al.
2013/0126992 A1 5/2013 Ehrenpfordt et al.
2013/0146994 A1 6/2013 Kittilsland et al.
2013/0147020 A1 6/2013 Gonska et al.
2013/0168740 A1 7/2013 Chen
2013/0181355 A1 7/2013 Tsai et al.
2013/0192363 A1 8/2013 Loreck et al.
2013/0192369 A1 8/2013 Acar et al.
2013/0204571 A1 8/2013 Savchenko et al.
2013/0210175 A1 8/2013 Hoisington et al.
2013/0214367 A1 8/2013 van der Heide et al.
2013/0221454 A1 8/2013 Dunbar et al.
2013/0241546 A1 9/2013 Fu
2013/0253335 A1 9/2013 Noto et al.
2013/0270657 A1 10/2013 Acar
2013/0270660 A1 10/2013 Bryzek et al.
2013/0277773 A1 10/2013 Bryzek et al.
2013/0283911 A1 10/2013 Ayazi et al.
2013/0285165 A1 10/2013 Classen et al.
2013/0299924 A1 11/2013 Weber et al.
2013/0315036 A1 11/2013 Paulson et al.
2013/0341737 A1 12/2013 Bryzek et al.
2014/0007685 A1 1/2014 Zhang et al.
2014/0090469 A1 4/2014 Comi et al.
2014/0090485 A1 4/2014 Feyh et al.
2014/0091405 A1 4/2014 Weber
2014/0092460 A1 4/2014 Schwedt et al.
2014/0116135 A1 5/2014 Cazzaniga et al.
2014/0116136 A1 5/2014 Coronato et al.
2014/0124958 A1 5/2014 Bowles et al.
2014/0125325 A1 5/2014 Ocak et al.
2014/0125359 A1 5/2014 El-Gamal et al.
2014/0137648 A1 5/2014 Zolfagharkhani et al.
2014/0138853 A1 5/2014 Liu et al.
2014/0162393 A1 6/2014 Yang
2014/0166463 A1 6/2014 Jahnes et al.
2014/0183729 A1 7/2014 Bowles
2014/0186986 A1 7/2014 Shu et al.
2014/0193949 A1 7/2014 Wu
2014/0203421 A1 7/2014 Shu et al.
2014/0210019 A1 7/2014 Nasiri et al.
2014/0227816 A1 8/2014 Zhang et al.
2014/0230548 A1 8/2014 Coronato et al.
2014/0231936 A1 8/2014 Jahnes et al.
2014/0231938 A1 8/2014 Campedelli et al.
2014/0260612 A1 9/2014 Aono et al.
2014/0260615 A1 9/2014 Simon et al.
2014/0260617 A1 9/2014 Ocak et al.
2014/0264648 A1 9/2014 Chu et al.
2014/0264650 A1 9/2014 Liu et al.
2014/0283605 A1 9/2014 Baldasarre et al.
2014/0287548 A1 9/2014 Lin et al.
2014/0291128 A1 10/2014 Kwa
2014/0311242 A1 10/2014 Lee et al.
2014/0311247 A1 10/2014 Zhang et al.
2014/0318906 A1 10/2014 Deimerly et al.
2014/0319630 A1 10/2014 Conti et al.
2014/0322854 A1 10/2014 Nakatani et al.
2014/0326070 A1 11/2014 Neul et al.
2014/0331769 A1 11/2014 Fell
2014/0339654 A1 11/2014 Classen
2014/0339656 A1 11/2014 Schlarmann et al.
2014/0349434 A1 11/2014 Huang et al.
2014/0352433 A1 12/2014 Hammer
2014/0353775 A1 12/2014 Formosa et al.
2014/0357007 A1 12/2014 Cheng et al.
2014/0370638 A1 12/2014 Lee et al.
2014/0374850 A1 12/2014 Chen et al.
2014/0374854 A1 12/2014 Xue
2014/0374917 A1 12/2014 Weber et al.
2014/0374918 A1 12/2014 Weber et al.
2015/0008545 A1 1/2015 Quevy et al.
2015/0115376 A1 4/2015 Chen et al.
2015/0191345 A1 7/2015 Boysel et al.
2015/0198493 A1 7/2015 Kaelberer et al.
2015/0226762 A1 8/2015 Seshia et al.
2015/0266723 A1* 9/2015 Chan ........................ H04R 1/08 257/416
2015/0329351 A1 11/2015 Cheng et al.
2015/0330782 A1 11/2015 Johnson et al.

(56) References Cited

U.S. PATENT DOCUMENTS

| | | | |
|---|---|---|---|
| 2015/0353346 | A1 | 12/2015 | Heuck et al. |
| 2015/0371390 | A1 | 12/2015 | Gassner et al. |
| 2016/0003923 | A1 | 1/2016 | Zieren et al. |
| 2016/0060104 | A1 | 3/2016 | Chu et al. |
| 2016/0229684 | A1 | 8/2016 | Boysel |
| 2016/0289063 | A1 | 10/2016 | Ocak et al. |
| 2016/0327446 | A1 | 11/2016 | Classen et al. |
| 2019/0226848 | A1 | 7/2019 | Nasiri et al. |
| 2024/0210174 | A1 | 6/2024 | Boysel et al. |
| 2024/0230332 | A1 | 7/2024 | Boysel et al. |

FOREIGN PATENT DOCUMENTS

| | | | |
|---|---|---|---|
| EP | 1819012 | A2 | 8/2007 |
| EP | 2410344 | A2 | 1/2012 |
| EP | 2544302 | A1 | 1/2013 |
| EP | 2693182 | A1 | 2/2014 |
| EP | 2693183 | A1 | 2/2014 |
| EP | 3019442 | A1 | 5/2016 |
| JP | 2008-114354 | A | 5/2008 |
| JP | 2008-132587 | A | 6/2008 |
| JP | 2009-245877 | A | 10/2009 |
| JP | 2011-194478 | A | 10/2011 |
| JP | 2012-247192 | A | 12/2012 |
| JP | 2013-030759 | A | 2/2013 |
| JP | 2013-164285 | A | 8/2013 |
| WO | 2008/086530 | A2 | 7/2008 |
| WO | 2009/009803 | A2 | 1/2009 |
| WO | 2009/057990 | A2 | 5/2009 |
| WO | 2011/151098 | A2 | 12/2011 |
| WO | 2012/037539 | A1 | 3/2012 |
| WO | 2013/116356 | A1 | 8/2013 |
| WO | 2014/122910 | A1 | 8/2014 |
| WO | 2014/159957 | A1 | 10/2014 |
| WO | 2014/177542 | A1 | 11/2014 |
| WO | 2014/184025 | A1 | 11/2014 |
| WO | 2015/003264 | A1 | 1/2015 |
| WO | 2015/013827 | A1 | 2/2015 |
| WO | 2015/013828 | A1 | 2/2015 |
| WO | 2015/038078 | A1 | 3/2015 |
| WO | 2015/042700 | A1 | 4/2015 |
| WO | 2015/042701 | A1 | 4/2015 |
| WO | 2015/042702 | A1 | 4/2015 |
| WO | 2015/103688 | A1 | 7/2015 |
| WO | 2016/044932 | A1 | 3/2016 |

OTHER PUBLICATIONS

Boysel, A Single-Proof-Mass MEMS Multi-Axis Motion Sensor. Semicon Japan. 6 pages. (2008).

Boysel, White Paper Series: Virtus Sensor Technology. Virtus Advanced Sensors. Semicon Japan, 11 pages. Nov. 11, 2008.

Chan et al., A Monolithically Integrated Pressure/Oxygen/Temperature Sensing SoC for Multimodality Intracranial Neuromonitoring. IEEE Journal of Solid-State Circuits. Nov. 2014;49(11):2449-61.

Hansen et al., A New Single Mass Triaxial Accelerometer for Modal Analysis. IMAC-XXI: A Conference & Exposition on Structural Dynamics, 8 pages, (2003).

Kruger et al., LiDAR-based Relative Positioning for Swarm Exploration on Mars. Proceedings of the 2014 International Technical Meeting of The Institute of Navigation. pp. 424-430, Jan. 27-29, 2014.

Merdassi et al., Design and Fabrication of 3-Axis Accelerometer Sensor Microsystem for Wide Temperature Range Applications Using Semi-Custom Process. Proc of SPIE. Mar. 2014;8973:897300-1-897300-12.

Merdassi et al., Design of 3-axis Capacitive Low-Gravity MEMS Accelerometer with Zero Cross-Axis Sensitivity in a Commercial Process. NSTI-Nanotech, www.nsti.org. Jan. 2013;2:185-188.

Tabata et al., Two-axis detection resonant accelerometer based on rigidity change. SPIE, Proceedings vol. 3514, Micromachined Devices and Components IV. Sep. 8, 1998.

Watanabe et al., SOI micromachined 5-axis motion sensor using resonant electrostatic drive and non-resonant capacitive detection mode. Sensor and Actuators A. 2006; 130-131:116-123.

Yang et al., A new silicon triaxial resonant micro-accelerometer. 2014 International Conference on Information Science, Electronics and Electrical Engineering. pp. 1283-1286, Apr. 26-28, 2014.

Yang et al., A new z-axis resonant micro-accelerometer based on electrostatic stiffness. Sensors (Basel). Jan. 5, 2015;15(1):687-702.

European Search Report for Application No. 14822259.9 dated Jan. 4, 2017.

Supplementary European Search Report for Application No. 14831791.0, dated Jun. 12, 2017, 8 pages.

International Search Report and Written Opinion for Application No. PCT/CA2014/050729, dated Nov. 3, 2014.

International Search Report and Written Opinion for Application No. PCT/CA2014/050902, dated Dec. 15, 2014.

International Search Report and Written Opinion for Application No. PCT/CA2014/050904, dated Dec. 1, 2014.

International Search Report and Written Opinion for Application No. PCT/CA2014/050910, dated Dec. 22, 2014.

International Search Report and Written Opinion for Application No. PCT/CA2014/051245, dated Febuary 25, 2015.

International Search Report and Written Opinion for Application No. PCT/CA2015/050018, dated Apr. 20, 2015.

International Search Report and Written Opinion for Application No. PCT/CA2015/050026, dated Apr. 27, 2015.

International Search Report and Written Opinion for Application No. PCT/CA2016/050303, dated Jun. 13, 2016. 7 pages.

International Search Report and Written Opinion for Application No. PCT/US2017/015393, dated Apr. 26, 2017. 17 pages.

International Search Report for Application No. PCT/CA2014/050730, dated Nov. 3, 2014. 3 pages.

International Search Report for Application No. PCT/CA2016/050031, dated Mar. 16, 2016. 3 pages.

* cited by examiner $1\times10^{-11}$
C(.1·mm, p)
C(.2·mm, p)
$1\times10^{-12}$
C(.3·mm, p)
$1\times10^{-13}$
0
$4\times10^{4}$
$8\times10^{4}$
p

MEMS PRESSURE SENSOR

RELATED APPLICATIONS

This patent application is a continuation of U.S. patent application Ser. No. 17/012,896 filed Sep. 4, 2020, which is a continuation of U.S. patent application Ser. No. 16/694,607, filed Nov. 25, 2019, which is a continuation of Ser. No. 15/302,731, filed Oct. 7, 2016, which is a National Stage application under 35 U.S.C. § 371 of International Patent Application PCT/CA2015/050026, filed Jan. 15, 2015, which claims priority to U.S. Provisional Application 61/977,776, filed Apr. 10, 2014, each of the above applications being incorporated by reference herein in its entirety.

TECHNICAL FIELD OF THE INVENTION

This invention relates to MicroElectroMechanical Systems (MEMS) pressure sensors and more particularly relates to a capacitive MEMS pressure sensor. The invention also relates to a method of manufacturing MEMS pressure sensors.

BACKGROUND

Micro-electro-mechanical system (MEMS) devices, in particular inertial sensors such as accelerometers and angular rate sensors or gyroscopes, are being used in a steadily growing number of applications. Due to the significant increase in consumer electronics applications for MEMS sensors such as optical image stabilization (OIS) for cameras embedded in smart phones and tablet PCs, virtual reality systems and wearable electronics, there has been a growing interest in utilizing such technology for more advanced applications which have been traditionally catered to by much larger, more expensive and higher grade non-MEMS sensors. Such applications include single and multiple-axis devices for industrial applications, inertial measurement units (IMUs) for navigation systems and attitude heading reference systems (AHRS), control systems for unmanned air, ground and sea vehicles and for personal indoor GPS-denied navigation. These applications also may include healthcare, medical and sports performance monitoring and advanced motion capture systems for next generation virtual reality. These advanced applications often require lower bias drift and higher sensitivity specifications well beyond the capability of existing consumer-grade MEMS inertial sensors on the market. In order to expand these markets and to create new ones, it is desirable and necessary that higher performance specifications be developed. It is also necessary to produce low cost and small size sensor which can be integrated in MEMS inertial sensor-enabled system(s).

In particular, there has been increasing interest in using advanced MEMS inertial sensors (accelerometers and gyroscopes) to develop low-cost miniature Inertial Measurement Units (IMUs) for navigation systems (i.e. Inertial Navigation Systems or "INS") and Attitude Heading Reference Systems (AHRS) for unmanned air, ground and sea vehicles. There has also been a growing need to develop both military and commercial grade personal navigation systems (PNS). MEMS accelerometers and gyroscopes, being much smaller than traditional mechanical gyroscopes, are subject to higher mechanical noise and drift. Since position and attitude are calculated by integrating the acceleration and angular rate data, the noise and drift lead to growing errors in position. Consequently, for navigation applications, it is desirable to augment the MEMS 6DOF inertial capability (3 axes of acceleration and 3 axes of angular rotation) with pressure and other measurements via sensor fusion. Pressure can provide altitude information which can be used as a check against MEMS drift in order to "re-zero" the error.

As is known in the art, a pressure sensor converts a difference in pressure into a variation in an electrical quantity such as capacitance or resistance. Miniature pressure sensors fabricated with semiconductor or MEMS technology chiefly consist of two types: capacitive and piezoresistive. A pressure sensor typically consists of a thin flexible membrane suspended over a cavity that is evacuated (for absolute pressure measurements) or filled with a gas at some fixed pressure (for relative pressure measurements). A pressure difference across the membrane causes it to deflect. The deflection can be measured by placing piezoresistors at the edge of the membrane and measuring the change in resistance as taught by U.S. Pat. Nos. 6,417,021 B1 or 8,468,888 B2 for example. Alternatively, the deflection can be measured by monitoring the capacitance formed by the membrane and the bottom of the cavity as taught by U.S. Pat. Nos. 8,316,718 B2 or 6,743,654 B2 for example. Capacitive sensors are increasingly popular because they consume less power than piezoresistive sensors.

In order to improve the performance of MEMS IMUs, a pressure sensor can be added by using commercial off-the-shelf (COTS) sensors placed on the IMU board or package substrate with the inertial sensors, or by stacking them on the MEMS inertial sensor die to produce a System-In-Package or "SIP". However, with either approach, additional lateral or vertical board or chip space is required to accommodate the footprint of the pressure sensor, as well as additional wire bonding or integrated circuit (IC) soldering to establish electrical connections with the pressure sensor and an external integrated circuit (IC) or printed circuit board (PCB) in order to read the pressure sensor signal.

There is thus need for an improved MEMS pressure sensor and manufacturing method.

SUMMARY OF THE INVENTION

The present invention provides a design for a pressure sensor that can be integrated into a MEMS 3D System Chip. This invention also provides a method of manufacturing, which allows packaging the sensor with an IC at the wafer level.

According to an aspect of the invention, a MEMS pressure sensor is provided. The MEMS includes a top cap wafer, a MEMS wafer and a bottom cap wafer. At least the top cap wafer and the MEMS wafer are electrically conductive. The MEMS wafer has first and second opposite sides and has formed therein a frame and a membrane. The frame defines at least one cavity, and the membrane is suspended by the frame over the at least one cavity on the first side of the MEMS wafer. The top cap wafer has inner and outer sides, the top cap wafer being bonded on its inner side to the first side of the MEMS wafer. The inner side of the top cap wafer has at least one recess defining with the membrane at least one capacitance gap.

The top cap wafer has formed therein at least one top cap electrode located over the membrane and forming, together with the membrane, at least one capacitor to detect a deflection of the membrane. The top cap includes at least a first electrical contact and a second electrical contact provided on the top cap wafer. The first electrical contact is connected to one of the at least one top cap electrode and the second electrical contact is connected to the membrane by way of an insulated conducting pathway extending from the membrane and through the top cap wafer.

The bottom cap wafer has inner and outer sides, the bottom cap wafer being bonded on its inner side to the second side of the MEMS wafer, enclosing the at least one cavity.

A vent is provided in at least one of the top cap, bottom cap and MEMS wafer, the vent extending from outside of the MEMS pressure sensor into one of the at least one cavity and the at least one capacitance gap.

In some embodiments, the at least one top cap electrode is delimited by corresponding insulated closed-loop channel (s) patterned in the top cap wafer, extending from the inner to the outer side of the top cap wafer, electrically insulating the at least one top cap electrode from the remainder of the top cap wafer.

In some embodiments, the MEMS wafer is a SOI (Silicon-On-Insulator) wafer with a device layer, a handle layer and an insulating layer, such as buried oxide. The insulating layer separates the device layer from the handle layer, the membrane being formed in the device layer.

In some embodiments, at least one SOI conducting shunt extends in the insulating layer, electrically connecting the device and handle layers. The at least one SOI conducting shunt forms part of the insulated conducting pathway connecting the membrane to the second electrical contact of the top cap wafer.

In some embodiments, the bottom cap wafer is electrically conductive, and is typically made of a silicon-based wafer, similar to the top cap wafer.

In some embodiments, at least one additional electrical contact is provided on the outer side of the bottom cap wafer, connected to an electrical contact on the top cap wafer via an insulated feedthrough extending successively through the top cap wafer, through the MEMS wafer and through the bottom cap wafer.

In some embodiments, the at least one cavity and the at least one capacitance gap is hermetically sealed under vacuum. The membrane may comprise at least one ring of conductive shunt material. The membrane may have its outer periphery delimited by a trench etched in the device layer. The outer periphery of the membrane preferably extend beyond the at least one cavity.

In some embodiments, the MEMS pressure sensor is a differential pressure sensor. In this case, in the MEMS wafer, the frame comprises an outer lateral section and an inner section. The at least one cavity comprises a first cavity and a second cavity, the membrane being suspended over the first and the second cavities by the outer lateral section and by the inner section of the frame. In the top cap wafer, the at least one recess comprises a first recess and a second recess and the at least one capacitance gap comprises a first capacitance gap and a second capacitance gap. In the top cap wafer, the least one top cap electrode comprises a first electrode and a second electrode, respectively forming, together with the membrane, a first capacitor and a second capacitor. The top cap wafer comprises a third electrical contact, the first electrical contact being connected to the first electrode and the third electrical contact being connected to the second electrode.

In some embodiments of the differential pressure sensor, the first and the second capacitance gaps and one of the first and second cavities are hermitically sealed under vacuum, the vent extending into the other one of the first and second cavities.

According to another aspect of the invention, a method for manufacturing a MEMS pressure is also provided. The method may include the following steps:

a) providing top and bottom cap wafers having respective inner and outer, at least the top cap wafer being electrically conductive;
b) forming in the top cap wafer at least one recess and at least one top cap electrode;
c) providing a MEMS wafer being electrically conductive and having first and second sides, and patterning a periphery of a membrane on the first side;
d) bonding the inner side of the top cap wafer to the first side of the MEMS wafer with the at least one recess facing the membrane to form at least one capacitance gap, said at least one top cap electrode being located over the membrane and forming, together with the membrane, at least one capacitor across to detect a deflection of the membrane;
e) forming at least one cavity on the second side of the MEMS wafer, the at least one cavity delimiting a frame and a bottom surface of the membrane;
f) forming a vent in at least one of the top cap, bottom cap and MEMS wafer;
g) bonding the inner side of the bottom cap wafer to the second side of the MEMS wafer and enclosing said at least one cavity, the vent extending into one of said at least one cavity and said at least one capacitance gap; and
h) removing a portion of the outer side of the top cap wafer to isolate the at least one top cap electrode from the remainder of the top cap wafer.

The method may include the step of forming at least first and second electrical contacts on the top cap wafer, the first electrical contact being connected to one of said at least one top cap electrode and the second electrical contact being electrical connected to the membrane via the top cap wafer.

In some embodiments of the method, step b) may comprises etching closed-loop trenches and filing or lining said trenches with an insulated material to electrically insulate the at least one top cap electrode from the remainder of the top cap wafer.

In some embodiments of the method, in step c), the MEMS wafer may be a SOI wafer with an insulating layer separating a device layer from a handle layer, and wherein the periphery of the membrane is patterned in the device layer.

In some embodiments of the method, step c) may comprise a step of creating at least one SOI conducting shunt extending in the insulating layer and electrically connecting the device and handle layers, one of said at least one SOI conducting shunt electrically connecting the membrane to the second electrical contact of the top cap wafer.

In some embodiments of the method, in step a), the bottom cap wafer can be electrically conductive, the method comprising a step of forming at least one additional electrical contact provided on the outer side of the bottom cap wafer.

In some embodiments of the method, in steps d) or g), at least one of the at least one cavity and said at least one capacitance gap is hermetically sealed under vacuum.

In some embodiments of the method, step c) may comprise a step of etching at least one ring on the first side of the MEMS wafer and filling the trench with conductive shunt material, to surround at least a portion of the membrane.

Typically, in step d) and g), the bonding is made with a conductive bond.

The steps of the method do not need to be necessarily in the order presented above. The method can include additional steps of creating insulated channels such as feed-throughs extending from the top to the bottom cap wafers. The method can also include a step of flip chip bonding an IC circuit to the top cap wafer of the MEMS pressure sensor. The method can also include an optional step of bump bonding the MEMS sensor to a printed circuit board (PCB).

A similar method as described above can also be provided to manufacture a differential pressure sensor.

DESCRIPTION OF THE DRAWINGS

It is noted that the appended drawings illustrate only exemplary embodiments of the invention and are, therefore, not to be considered limiting of the scope of the invention as defined by the appended claims, for the invention may admit to other equally effective embodiments.

DETAILED DESCRIPTION OF AN EMBODIMENT OF THE INVENTION

Figure 1:
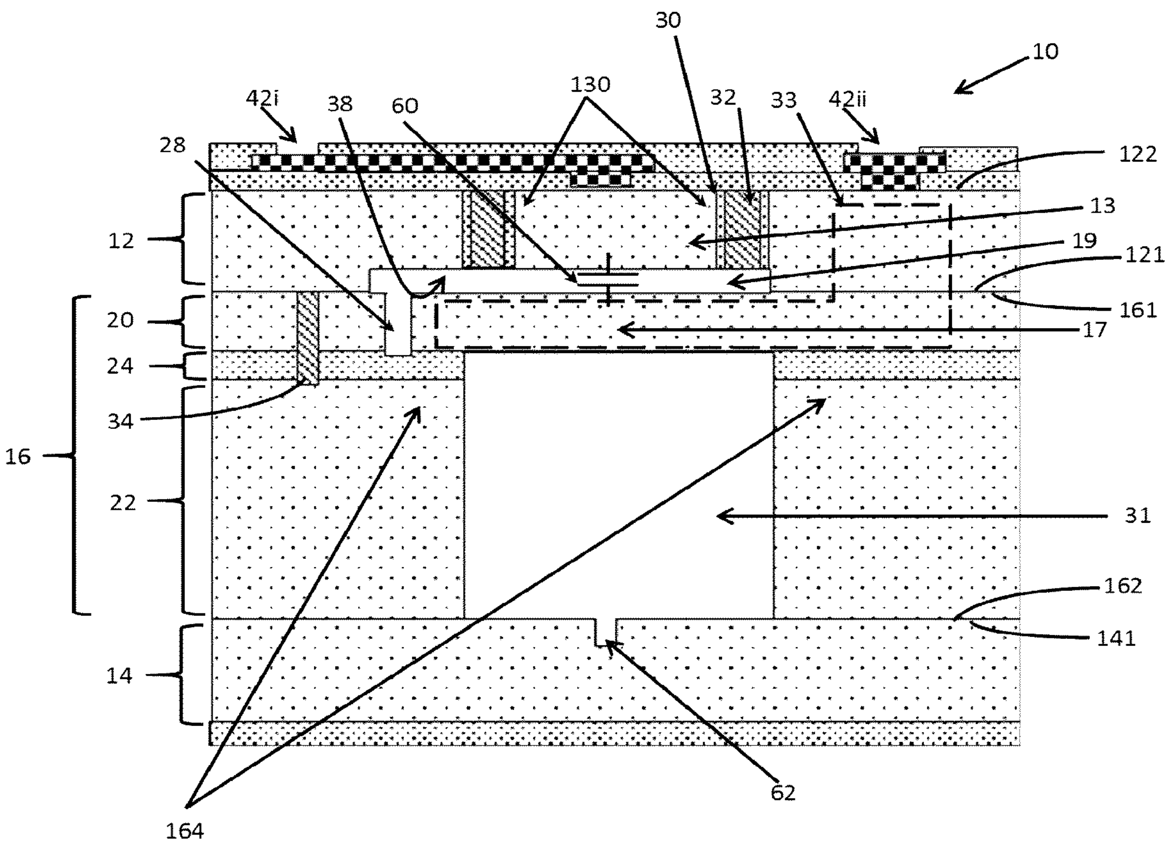
FIG. 1 is a cross-sectional view of a MEMS pressure sensor device, according to an illustrative embodiment of the present invention.

Within the following description, similar features of the drawings have been given similar reference numerals. To preserve the clarity of the drawings, some reference numerals have been omitted when they were already identified in a preceding figure.

Broadly described, the present invention provides a MEMS pressure sensor formed by a top cap wafer, a central MEMS wafer and a bottom cap wafer, with all three wafers being preferably made of an electrically conducting material, such as a silicon-based material. In some embodiments, only the top and central MEMS wafer can be conductive. The MEMS pressure sensor includes insulated conducting pathways, some forming feedthroughs extending from the bottom cap wafers, through the MEMS wafer and to the top cap wafers, allowing the transmitting of electrical signals through the MEMS sensor, from the bottom cap wafer to the top cap wafer. As least one insulated conducting pathway extend from the membrane and through the top cap wafer to electrical contacts formed on the top cap wafer. This architecture of the MEMS sensor enables the placement of electrodes and electrical leads above, below, and/or around the flexible membrane and allows routing the signals to at least one side of the sensor, where the signals can be accessed for signal processing. Additionally, this architecture enables wire-bond-free electrical connection to an integrated circuit (IC) which can be flip-chip bonded to the top of the MEMS sensor either at the chip or wafer level, reducing the cost of MEMS and IC integration, as well as packaging complication and packaging cost. This architecture allows allows integrating the MEMS pressure sensor with a motion sensor, such as described in PCT/CA2014/050730.

Now referring to FIG. 1, a MEMS pressure sensor in accordance with an illustrative embodiment of the present invention and generally referred to using the reference numeral 10 will now be described within the constraints of a three dimensional system (3DS) architecture. The pressure sensor 10 is formed from a multi-wafer stack structure comprising a central MEMS wafer 16 having first and second sides 161, 162, and having formed therein a frame 164 and a membrane 17, the frame defining or outlining at least partically a cavity 31. The membrane 17 is suspended over the cavity 31.

In this embodiment, the cavity 31 is connected or in fluid communication with the outside atmosphere of the pressure sensor 10 by means of a vent or channel 62. The MEMS wafer 16 is preferably made of a silicon-based material. In this case, the MEMS wafer 16 is a SOI wafer with a device layer 20, a handle layer 22 and an insulating layer 24. The insulating layer 24 separates the device layer 20 from the handle layer 22. The membrane 17 is formed in the device layer 20, and membrane has an outer periphery delimited by a trench 28. The membrane 17 is patterned in the device layer such that it extend beyond the cavity 31. The membrane is preferably circular to facilitate capacitance calculations. In other embodiments, the membrane 17 and cavity 31 could be fabricated of multiple stacked wafers.

Of note, in the present description, the term "top" and "bottom" relate to the position of the wafers as shown in the figures. Unless otherwise indicated, positional descriptions such as "top", "bottom" and the like should be taken in the context of the figures and should not be considered as being limitative. For example, the top cap wafer 12 can also be referred to as a first cap wafer, and the bottom cap wafer 14 can be referred to as a second cap wafer. The terms "top" and "bottom" are used to facilitate reading of the description, and persons skilled in the art of MEMS understand that, when in use, the MEMS pressure sensor 10 can be placed in different orientations such that the top cap wafer 12 and the bottom cap wafer 14 are positioned upside down. In this particular embodiment, the "top" refers to the direction of the device layer 20. It will also be noted here that the terms "top cap wafer", "MEMS wafer", "bottom cap wafer" and "IC wafer" are used for describing the different layers of the MEMS pressure sensor, and that these terms refers to the diced portion or section of larger wafers. During the manufacturing, as will described in more detail with reference to FIGS. 7 to 28, entire top, MEMS, and bottom wafers are patterned, processed and bonded, and the MEMS pressure sensors are obtained after dicing the bonded wafers into singulated or individual components.

Still referring to FIG. 1, the multiple layers are assembled to form the MEMS pressure sensor 10 such that the MEMS wafer 16 is surrounded by a first or top cap wafer 12, and a second or bottom cap wafer 14, which in this case are both electrically conductive and made of silicon-based material. As illustrated, the inner side 121 of the top cap wafer 12 is bonded to the first side 161 of the MEMS wafer 16, and the inner side 141 of the bottom cap wafer 14 is bonded to the second side 162 of the MEMS wafer 16. The inner side 121 of the top cap wafer 12 has a recess 38 defining with the membrane 17 a capacitance gap 19. The top cap wafer 12 has formed therein a top cap electrode 13 located over the membrane and forming, together with the membrane, at least one capacitor 60 to detect a deflection of the membrane 17. In particular, the top cap wafer 12 is bonded to and in electrical contact with the device layer 20 and the bottom cap wafer 14 is bonded to and in electrical in contact with the handle layer 22. To facilitate electrical connections between the layers, for example between the top cap wafer 12, the MEMS wafer 16 and the bottom cap wafer 14, such layers are preferably bonded using a conductive bond. When so bonded to the MEMS wafer 16, the top cap wafer 12 forms a hermetic vacuum seal with the MEMS wafer 16 to form the gap 19 between the top cap wafer 12 and the membrane 17 and the bottom cap wafer 14 forms a hermetic seal with the second side 162 of the MEMS wafer 16. Since the vent 62 is provided in the bottom cap wafer 14 and admits ambient pressure from the atmosphere outside the pressure sensor 10 to the cavity 31, the cavity 31 will also be at such an ambient pressure.

The top cap wafer includes electrical contacts, with at least a first electrical contact **42*i* being connected to the top cap electrode 13 and a second electrical contact 42*ii* being connected to the membrane 17 by way of an insulated conducting pathway 33 extending from the membrane and through the top cap wafer 12. The top cap electrode 13 is preferably delimited by an insulated closed-loop channel 130 patterned in the top cap wafer and extending from the inner to the outer side of the top cap wafer, electrically insulating the top cap electrode 13 from the remainder of the top cap wafer. The closed-looped channel 130 can be filled with an insulating material 30, or alternatively lined with an insulating material 30 and then filled with conducting material 32**.

Still referring to FIG. 1, the insulating layer 24, which typically consists of buried oxide, is provided between the handle layer 22 and the device layer 20 to electrically insulate the top half of the pressure sensor 10 from the bottom half, or more particularly to insulate the electrically bonded device layer 20 and top cap wafer 12 from the electrically bonded handle layer 22 and bottom cap wafer 14. An SOI conducting shunt as in 34 is provided through the insulating layer 24 to facilitate an electrical connection between the device layer 20 and handle layer 22, in specific desired places for the purposes as will be described hereinbelow.

Still referring to FIG. 1, the membrane 17, top electrode 13 formed by a delineated insulated portion of the top cap wafer 12, and vacuum gap 19 together form a variable capacitor, represented by reference 60. A pressure difference between the cavity 31 which is connected to the outside atmosphere of the pressure sensor 10 via the channel 62 and the sealed vacuum gap 19 causes the membrane 17 to deflect relative to the top electrode 13. The resulting deflection causes a corresponding variation in capacitance of the capacitor 60 formed between the membrane 17 and the top electrode 13 across the vacuum gap 19 which provides a measure of the outside atmospheric pressure.

Figures 2, 3:
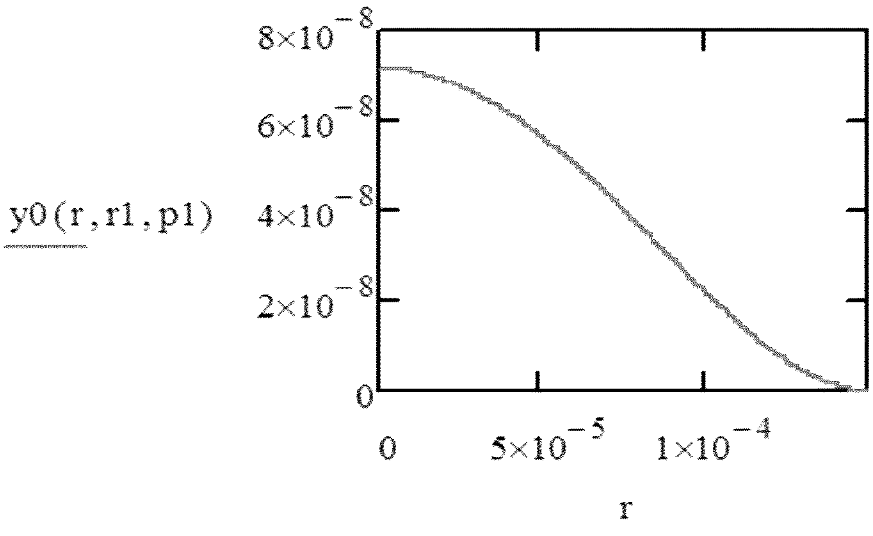
FIG. 2 is a plot of the deflection of a 0.01 mm thick, 0.3 mm diameter pressure sensor membrane of the pressure sensor of FIG. 1 at 1 atmosphere.
FIG. 3 is a plot of the capacitance of the pressure sensor of FIG. 1 as a function of pressure for several pressure sensor membrane diameters.

Now referring to FIG. 2 and FIG. 3, in addition to FIG. 1, the upward deflection y of a circular membrane 17 comprising a thickness t and a radius a under a uniform pressure load p as a function of distance r from its center is $$y(r) = \frac{p}{64D}(a^2 - r^2)^2$$

with $$D = \frac{Et^3}{12(1 - v^2)}$$

where E is Young's modulus and v is the Poisson ratio for the material of the membrane 17, in accordance with the illustrative body case silicon. A plot of the deflection of the membrane 17 as a function of distance r from its center is shown in FIG. 2. For small deflections of the membrane 17, the resulting capacitance between the membrane 17 and the top electrode 13 across the vacuum gap 19 is $$C = C_0\left(1 + \frac{pa^4}{192Dd_0}\right),$$

where $d_0$ is the undeflected vacuum gap 19 thickness, and $$C_0 = \frac{\epsilon_0 \pi r^2}{d_0}$$

is the at-rest capacitance of the capacitor 60. As illustrated in FIG. 3, for a membrane 17 comprising a thickness of 10 μm, a membrane radius on the order of a few tenths of a millimeter are adequate to achieve a measureable capacitance change in the 0.1-1 pF range of the capacitor 60.

Figure 4:
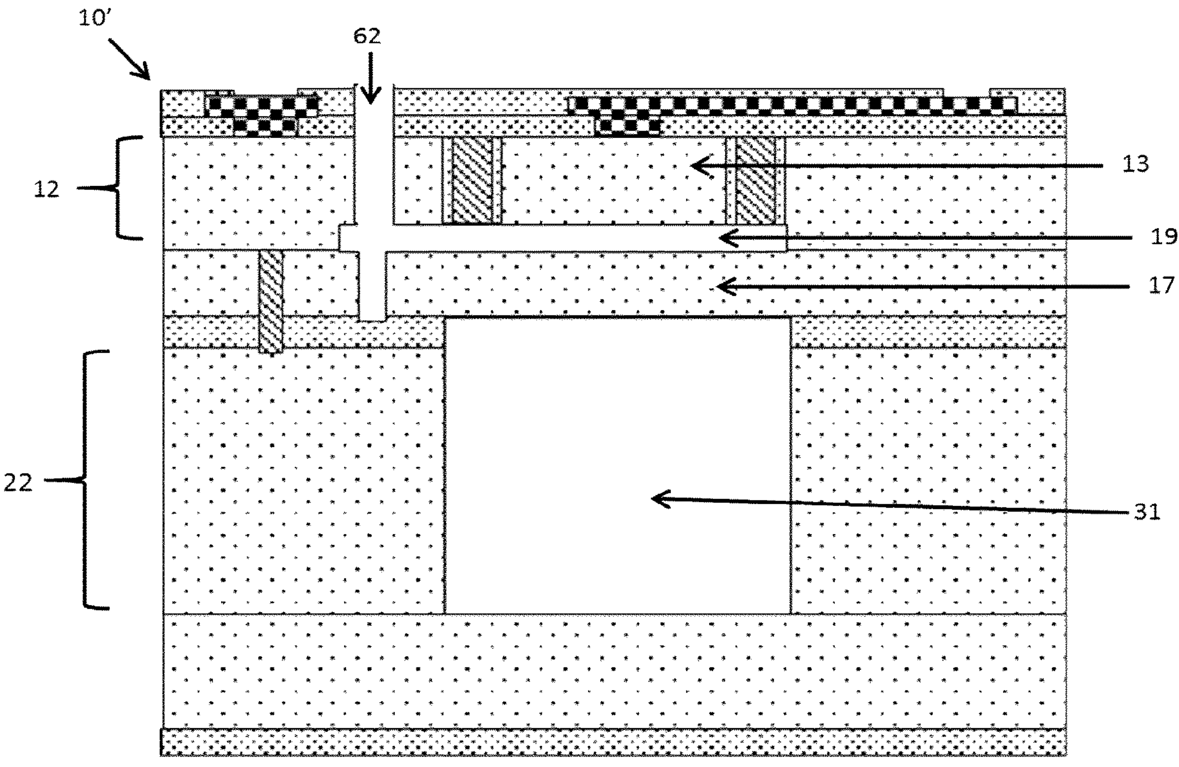
FIG. 4 is a cross-sectional view of an alternative illustrative embodiment of the pressure sensor of FIG. 1, with the atmospheric pressure channel provided in the top cap wafer.

Now referring to FIG. 4, in accordance with an alternate embodiment of the present invention, there is shown a MEMS pressure sensor 10' having the channel 62 patterned in the top cap wafer 12 with the cavity 30 being sealed from the outside of the pressure sensor 10. Other alternative methods of implementing the MEMS pressure sensor 10 within the constraints of the three dimensional system (3DS) architecture may also be provided. The channel 62 venting into the cavity 31 can also be placed in the handle layer 22 instead of the top cap silicon wafer 12. Alternatively, the pressure channel 62 can be patterned in the bottom cap wafer 14 and the vacuum gap 19 can be sealed under vacuum.

In accordance with an alternate embodiment of the present invention, the MEMS pressure sensor can be implemented as a relative pressure sensor (as opposed to an absolute pressure sensor) by adding a channel as in 62 in the top cap wafer 12 leading to the vacuum gap 19 and by adding another channel as in 62 in the bottom cap wafer 14 leading to the cavity 31 (not shown). In this case the deflection of the membrane 17 will be determined by the pressure difference between the top vacuum gap 19 and the cavity 31. The membrane 17 can deflect either upward or downward relative to the electrode 13 depending upon the relative pressures in the cavity 31 and the top vacuum gap 19. If the pressure sensor is used in this way, the two channels as in 62 must be exposed to different pressure environments, which may require either providing external tubing or conduits (not shown) to interface the channels as in 62 to the two environments or inserting the pressure sensor 10 at the interface between the two pressure environments.

Figure 5:
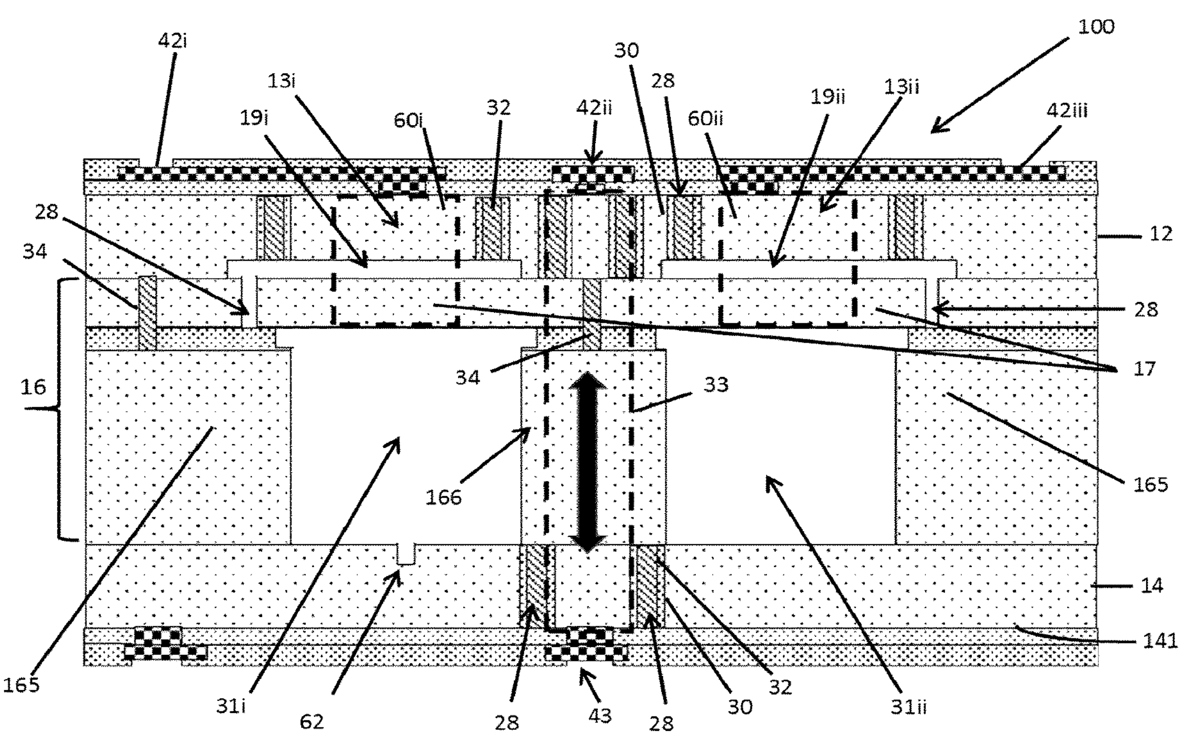
FIG. 5 is a cross-sectional view of a differential pressure sensor MEMS device, according to an illustrative embodiment of the present invention.
Figure 6:
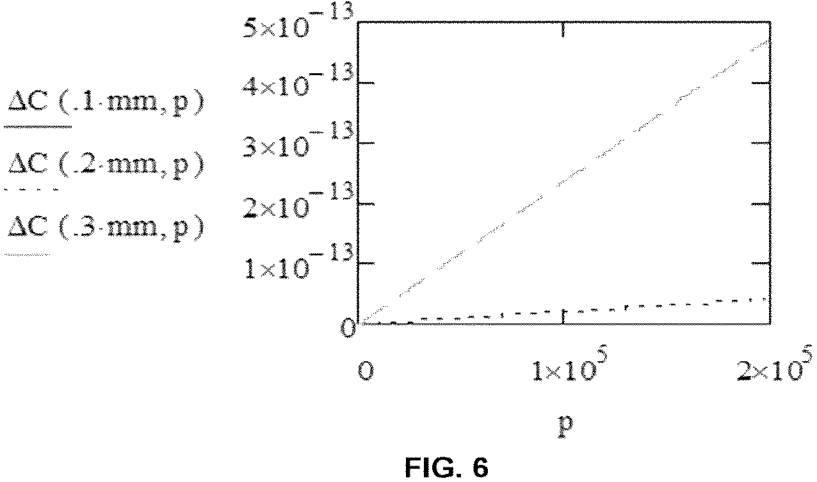
FIG. 6 is a plot of the differential capacitance of the capacitors of the differential pressure sensor of FIG. 5.

Now referring to FIG. 5 and FIG. 6, a pressure sensor 100 in accordance with an alternate embodiment of the present invention is shown, the pressure sensor 100 being in this case a differential pressure sensor. The sensitivity of the MEMS pressure sensor can be increased by subtracting off the at-rest capacitance of the capacitor **60*i* by differentially measuring the capacitance of the capacitor 60*i* and of an identical fixed reference capacitor 60*ii* provided above a cavity 31*ii* that is not connected to the outside of the pressure sensor 100. The sensor capacitor 60*i* and reference capacitor 60*ii* are fabricated as side-by-side MEMS pressure sensors as in FIG. 1. The capacitors 60*i*, 60*ii*, are preferably fabricated identically, forming part of identical MEMS structures except the pressure sensor 100 includes the channel 62 into the cavity 31*i*, whereas the reference capacitor 60*ii* provided over the cavity 31*ii* does not have a channel in fluid connection with the exterior of the pressure sensor. FIG. 5 illustrates the calculated enhanced capacitance change sensitivity versus pressure for several diameters of the membrane 17**.

More specifically, the frame comprises an outer lateral section 165 and an inner section 166. The MEMS central wafer 16 comprises a first cavity **31*i* and a second cavity 31*ii*, and the membrane 17 is suspended over the first and the second cavities 31*i*, 31*ii* by the outer lateral section 165 and by the inner section 166 of the frame. The top cap wafer 12 comprises first and second recesses for forming the capacitance gaps 19*i*, 19*ii*. The top cap wafer 12 comprises first and second electrodes 13*i*, 13*ii*, respectively forming, together with the membrane 17, the first capacitor 60*i* and the second capacitor 60*ii*. The top cap wafer comprises a third electrical contact 42*iii*, the first electrical contact 42*i* being connected to the first electrode 13*i*, the second electrical contact 42*ii* being connected to the membrane 17, and the third electrical contact 42*iii* being connected to the second electrode 13*ii*. The first and the second capacitance gaps 19*i*, 19*ii* and the second cavity 31*ii* are hermitically sealed under vacuum, and a vent 62 extends into the first cavity 31*i*, admitting ambient pressure from the atmosphere outside the pressure sensor 100 to the cavity 31*i***.

Still referring to FIG. 5, conducting electrical shunts are provided and penetrate the insulating buried oxide layer 24 to create conducting pathways to transmit electrical signals through the MEMS wafer layer 16, and possibly from the bottom to the top cap wafers 12, 14. Where needed, a TSV process can be used to insulate the conducting pathways, creating feedthroughs or leads to transmit electrical signals through the thickness of the sensor.

Figure 28:
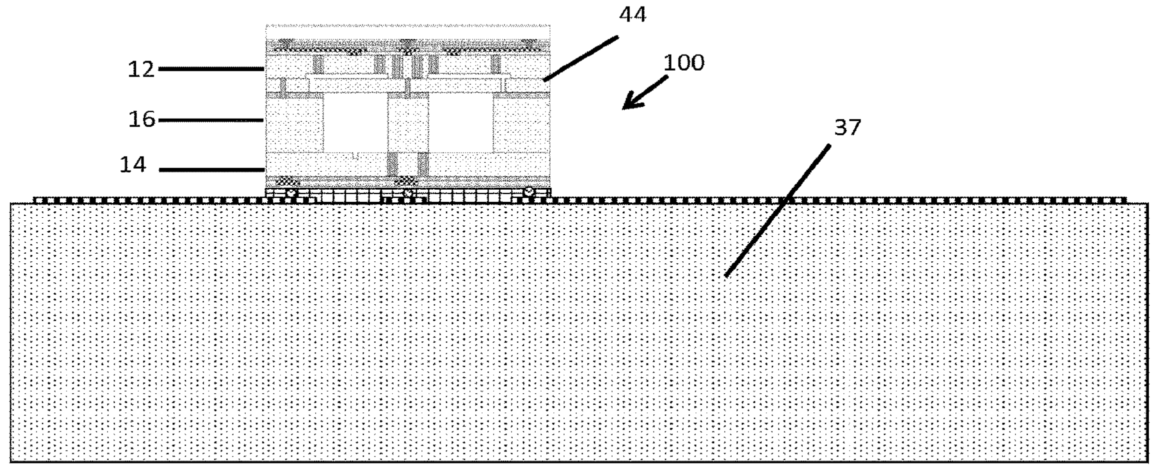
FIG. 28 shows a cross sectional view view of the MEMS pressure sensor of FIG. 5, of an IC chip and of a PCB, the IC chip being bonded to the top cap wafer of the MEMS pressure sensor, the bottom cap wafer being bonded to a PCB without wire bonding, the MEMS pressure sensor including insulated conducting pathways allowing to route signals from the PCB to the IC chip via insulated feed-throughs extending in the MEMS pressure sensor.

As shown in FIG. 5, the MEMS pressure sensor 100 can include additional electrical contacts, such as contact 43, formed on the outer side of the bottom cap wafer 14. Insulated conducting pathways, such as pathway 33, can extend successively from within the bottom cap wafer 14 through the MEMS wafer 16 and through the top cap wafer 12 to the respective electrical contacts on the top cap wafer 12, for routing electrical signals from the electrical contacts on the bottom cap wafer 14 to the electrical contacts on the top cap wafer 12. The MEMS stack forming the MEMS pressure sensor 100 thus comprises electrically isolated "three dimensional through-chip vias" (3DTCVs) to route signals from the bottom cap 14 through the MEMS wafer 16 to and through the top cap wafer 12. The term 3DTCV thus refers to an insulated conducting pathway, as in 33, extending in one or more directions in the MEMS device (i.e. transversal to and/or in the plane of the wafers). Since the bonds between the top and bottom cap wafers 12, 14 and the MEMS wafer 16 are electrically conductive, the cap wafers and the MEMS wafer 16 are electrically connected and form the insulated conducting pathways. Electrical contacts 43, typically a bond pad, is illustratively provided on the bottom cap wafer 14 to pass signals through the MEMS pressure sensor 100, for example from an IC bonded to the top of pressure sensor 100, through the MEMS pressure sensor 100, and to an underlying IC or PCB (as shown in FIG. 28) bonded to the bottom of the MEMS pressure sensor 100. The insulating conducting pathway 33 acts as a feedthrough extending from the electrical contacts 42 on the top cap wafer 12 to the electrical contacts 43 on the bottom cap wafer 14. The insulating conducting pathway 33 is illustratively formed in the top cap wafer 12 and the bottom cap wafer 14 as delineated by the empty trenches as in 28 formed in the device handle layer 20 and trenches 28 filled within an insulating material 30 in the bottom cap wafer 14, and optionally with a conducting material 32 inside the insulated trenches. The insulating conducting pathway 33 is connected between the device layer 20 and the handle layer 22 by an SOI conducting shunt 34.

As can be appreciated, an aspect of the MEMs architecture described herein is the use of the insulated channels in a multi-wafer stack, to isolate individual electrodes and interconnects on the top and bottom cap wafers 12, 14. Trenches as in 28 are etched to "outline" the borders of the electrodes, leads, feedthroughs, and bond pads 23 on the inward-facing surfaces of the top and bottom wafers 12, 14. These trenches as in 28 are then filled with an insulating material such as thermal oxide or chemical vapor deposition (CVD) silicon dioxide. For manufacturing the MEMS device of the present invention, different TSV processes can be used to isolate electrodes and form the insulated conducting pathways as in 33 in the top and bottom cap wafers 12, 14. The various conducting pathways required by the MEMS pressure sensor are constructed by aligning the conducting pathways, or channels, in the top cap wafer 12, the MEMs wafer 16 and/or the bottom cap wafer 14 at the wafer interfaces. Some of the insulated conducting pathways as in 33 allow electrical signals to travel to and from the bottom cap electrodes 15 through the aligned insulated conducting pathways as in 33 in the top and bottom caps 12, 14 and the MEMS wafer 16. The insulated conducting pathways as in 33 in the MEMS wafer 16 thus form feedthroughs. In the case of SOI MEMS wafer 16, feedthroughs are formed in the SOI device layer 20 and handle layer 22 which are connected by SOI conducting shunts 34. The feedthroughs on the MEMS wafer 16 can be isolated either by insulator filled channels or by etched open trenches as in 28 since the MEMS wafer 16 is completely contained within the stack and the isolation trenches as in 28 do not have to provide a seal against atmospheric leakage like the cap trenches as in 28. An advantage of the MEMS pressure sensor of the present invention is that since the MEMS layer 16 is located between the top and bottom caps 12, 14, the cavity 31 can be hermetically sealed. If needed, the cavity 31 can be under vacuum or filled with fluid, such as inert gasses or liquids.

Fabrication Process

The method for manufacturing a MEMS pressure sensor will be described with reference to FIGS. 7 to 25, which schematically illustrate steps and possible sub-steps of an exemplary embodiment of the method. It will be noted that the method described is preferably a wafer level packaging method, and therefore entire wafers or large portions of wafers are used in the steps occurring before the dicing/singulating step. However, for clarity, in FIGS. 7 to 25, only the portion of the wafer corresponding to a single MEMS pressure sensor is shown, although a plurality of such MEMS sensors are typically manufactured on each wafer. As explained previously, the MEMS pressure sensor can be combined or integrated with other MEMS sensors, such as motion sensors, to increase the sensitivity of the MEMS component. One skilled in the art will understand that the portion of the wafer shown in FIGS. 7 to 25 can be repeated on the area of the corresponding wafers. In other words, the different steps of the method (such as the patterning, lining, depositing, grinding, passivating, bonding and dicing) are typically performed on the entire surface of the wafers (or at least on a substantial section of the wafers), at the "wafer-scale", in order to fabricate a plurality of preferably identical MEMS sensors. For clarity, the perspective and top views show only portions of the wafers associated to one of the many MEMS pressure sensors fabricated from entire wafers. It will also be noted that some steps of the method described below may not need to be performed in the same order.

Figure 7:
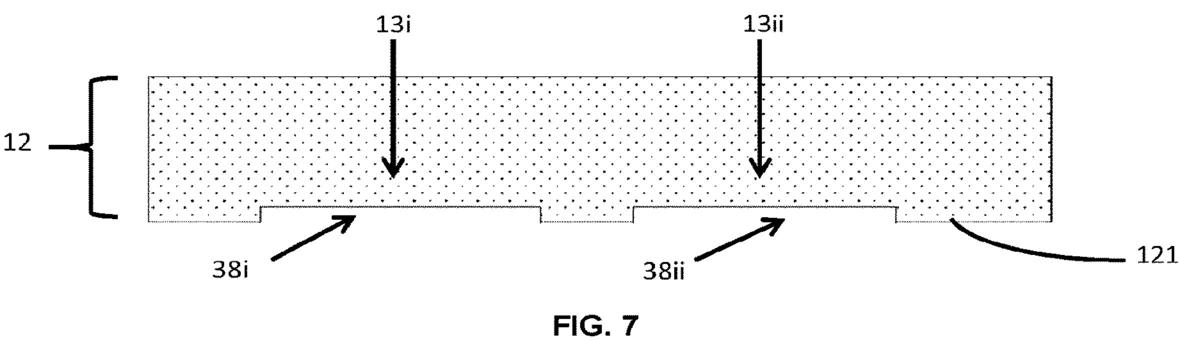
FIG. 7 is a cross-sectional view of the top cap wafer of the pressure sensor of FIG. 5 during a manufacturing step, illustrating the fabrication of a gap.
Figure 8:
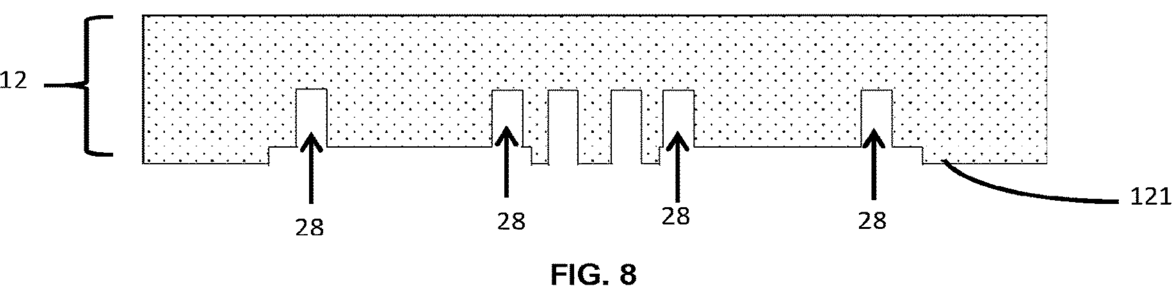
FIG. 8 is a cross-sectional view of the top cap wafer of FIG. 7, illustrating the fabrication of trenches in the top cap wafer.
Figure 9:
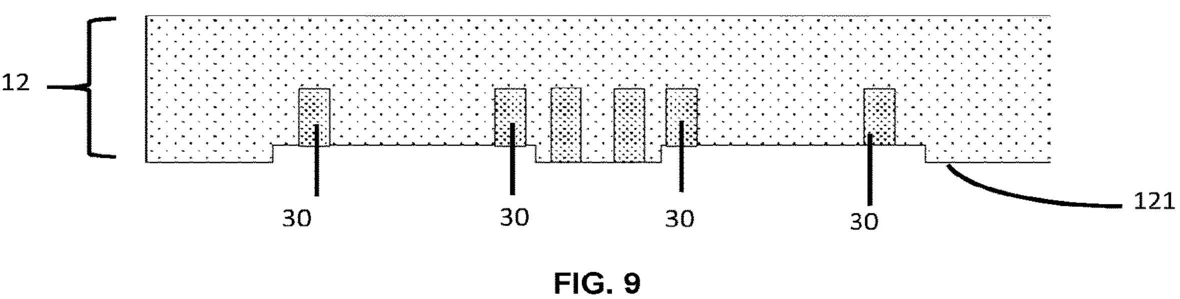
FIG. 9 is a cross-sectional view of the top cap wafer of FIG. 8, illustrating the fill of the trenches with an insulating material.
Figure 10:
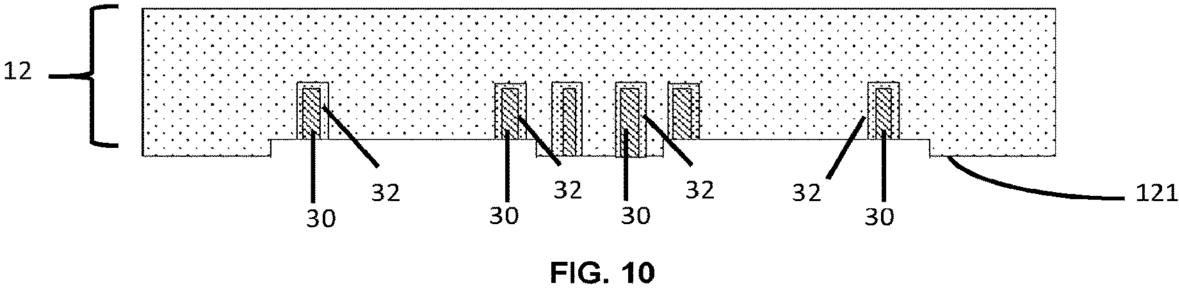
FIG. 10 is a cross-sectional view of the top cap wafer of FIG. 8, illustrating the fill of the trenches with an insulating material between the conductive material and the top cap wafer, according to another possible manufacturing step.

Referring to FIG. 7, the fabrication process of a pressure sensor similar to the one shown in FIG. 5 will now be described. However, it will be understood that there is no intent to limit the invention to the embodiment described. To begin construction of the MEMS pressure sensor 100 in accordance with an illustrative embodiment of the present invention, a silicon wafer, preferably a silicon-based wafer, which will form the top cap wafer 12, is patterned with the desired top electrodes 13*i*, 13*ii* by first patterning recesses 38 for forming the capacitance gaps. The recesses 38 are preferably circular, and are formed into at least part of the top cap wafer 12 on inner side 121 thereof. Such patterning can be done for example by etching, or by using other methods such as patterned oxidation and wet etch, as are generally known in the art.

Figure 11:
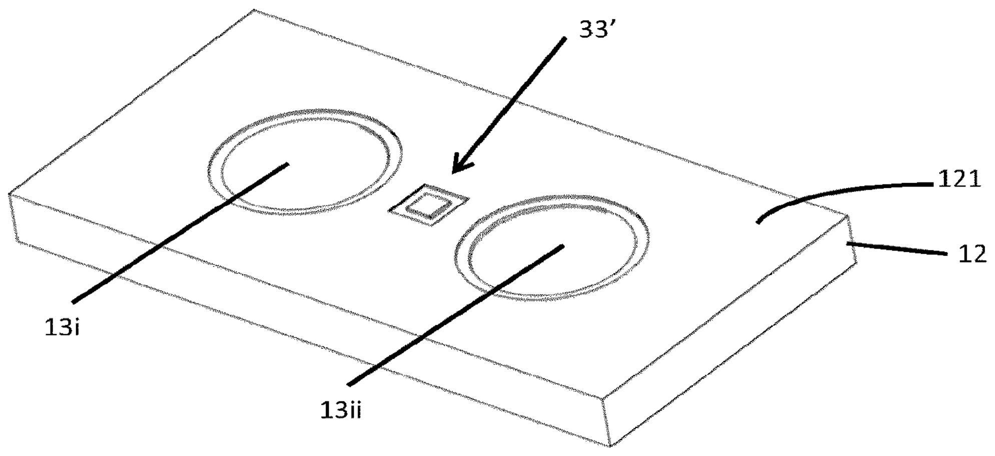
FIG. 11 is a bottom perspective view of the top cap wafer of FIG. 10 illustrating the manufactured inner side of the top cap wafer.

Referring to FIGS. 8, 9, 10, and 11, trenches 28 are next patterned in the silicon on the inner side 121 of top cap wafer 12. The trenches 28 are patterned to only extend partially through the top cap wafer 12 to form the top cap electrodes 13 and/or leads. The trenches 28 are then filled with either an insulating material 30 or an insulating layer followed by optionally a conductive fill 32. Various trench and fill processes as known in the art are available at different MEMS fabrication facilities and the insulating and conducting materials vary between them. What is needed is that islands of silicon be surrounded by electrically insulating barriers patterned into the silicon wafer at a sufficient depth greater than the final desired cap thickness. FIG. 11 shows the two round electrodes 13*i* and 13*ii* insulated from the remainder of the cap wafer, and the top portion 33' which will form part of the insulated conducting pathway 33 (identified in FIG. 5)

Figure 12:
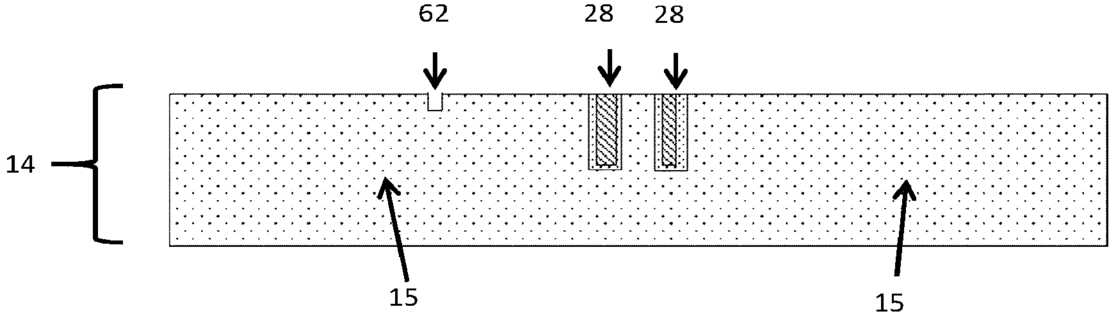
FIG. 12 is a cross-sectional view of the bottom cap wafer of the pressure sensor of FIG. 5, illustrating the fabricated vent, trench etch, and trench fill.
Figure 13:
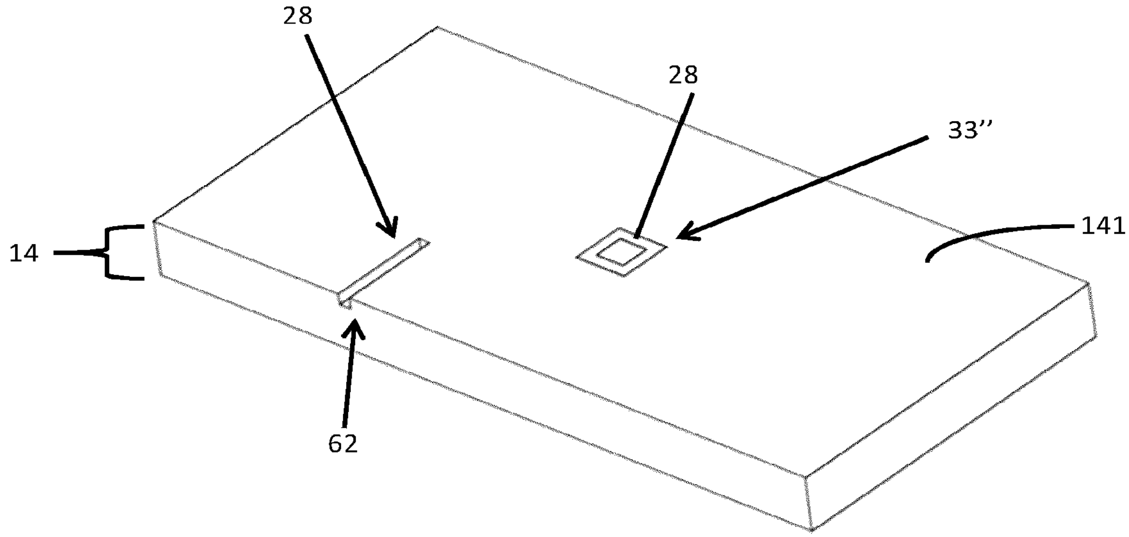
FIG. 13 is a top perspective view of the bottom cap wafer of FIG. 12, illustrating the fabricated vent, trench etch, and trench fill.

Referring to FIG. 12 and FIG. 13, the trench process performed on the top cap wafer to create trenches 28 is repeated on the bottom layer 14 to form the lower portion 33" of the insulated conducting pathway 33, and to form the vent 62. The bottom cap 14 does not require an actual electrode coupled with the membrane, since the bottom cap wafer 14 acts as merely a seal for the cavities 31*i*, 31*ii*. The bottom electrode 15 is used in this case only to form feedthroughs in the form of insulated conducting pathways as in 33 that enable input/output (I/O) signals to be fed through the MEMS pressure sensor 100 to and from the top cap for use by a sensor system (see FIG. 28). If these feedthroughs are not required, they can be eliminated completely from the bottom cap wafer 14. In this case, if the channel 62 can be placed in the handle layer 22 (not shown), and channel, gap, or trench patterning of the bottom cap wafer 14 would not be required.

Figure 14:
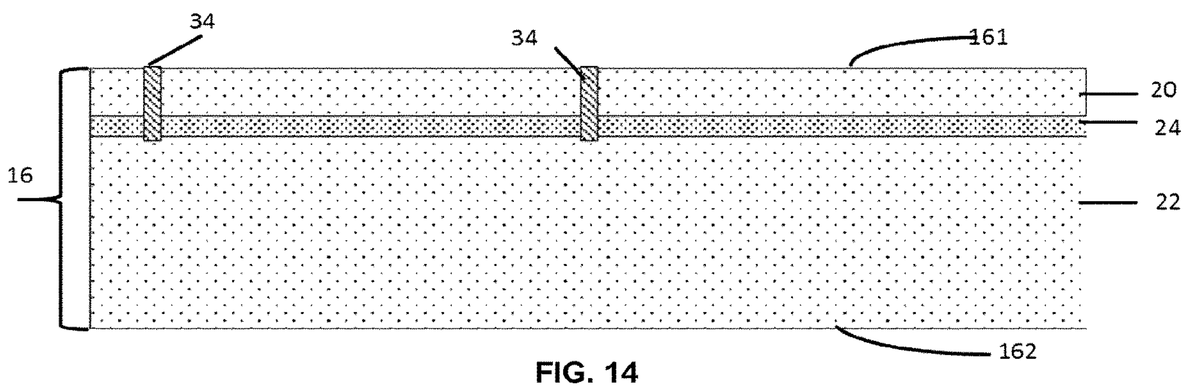
FIG. 14 is a cross-sectional view of the MEMS wafer of the pressure sensor of FIG. 5, illustrating the etch and fill of the SOI shunts through the insulating layer.
Figure 15:
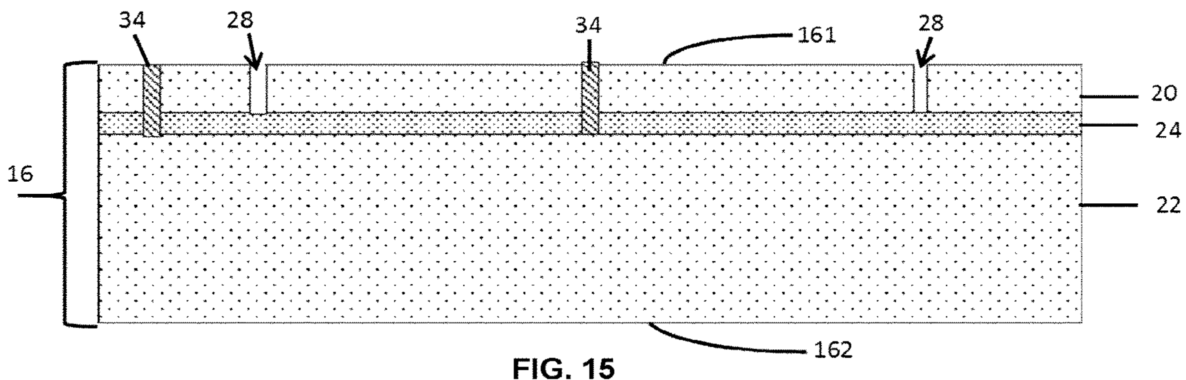
FIG. 15 is a cross-sectional view of the MEMS wafer of FIG. 14, illustrating the fabrication of trenches in the device layer.
Figure 16:
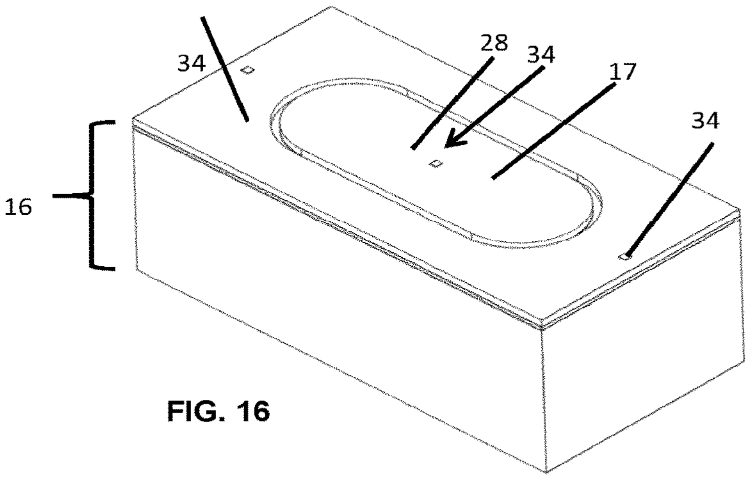
FIG. 16 is a top perspective view of the MEMS wafer of FIG. 15, illustrating the patterned trenches for forming the membrane, and the SOI shunts.

Referring to FIGS. 14 to 16, a MEMS wafer 16 is provided, having first and second sides 161, 162. In this embodiment, the MEMS wafer 16 is an SOI wafer with an insulating layer 24 separating the device layer 20 from the handle layer 22. SOI conducting electrical shunts as in 34 are formed into the first side 161 of the MEMS wafer 16 between the SOI device layer 20 and the SOI handle layer 22 through the buried oxide 24 by first opening vias patterned in the desired spots and etched through the SOI device layer 20 and buried oxide layer 24, to or slightly into the SOI handle layer 22. These vias are then filled with a conducting material, which can be for example doped polycrystalline silicon (polysilicon), metal, or other conducting material, to form the electrically conducting SOI shunts as in 34. As a result, an electrical path is formed vertically between the SOI device layer 20 and handle layer 22 at desired spots. A closed loop trench 28 is etched in the device layer 20 to delimit the periphery of the membrane 17.

Figure 17:
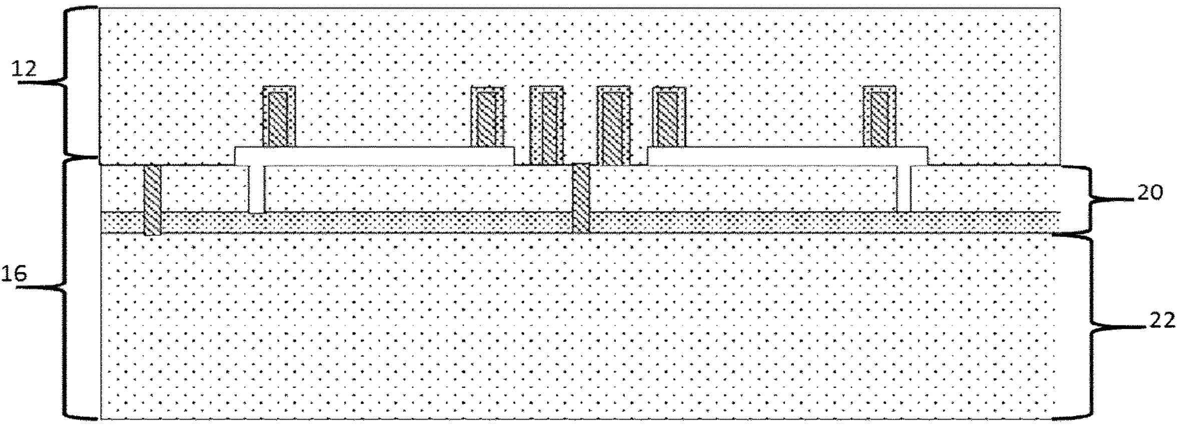
FIG. 17 is a cross-sectional view illustrating the bonding of the MEMS wafer of FIG. 15 to the top cap wafer of FIG. 10.
Figure 18:
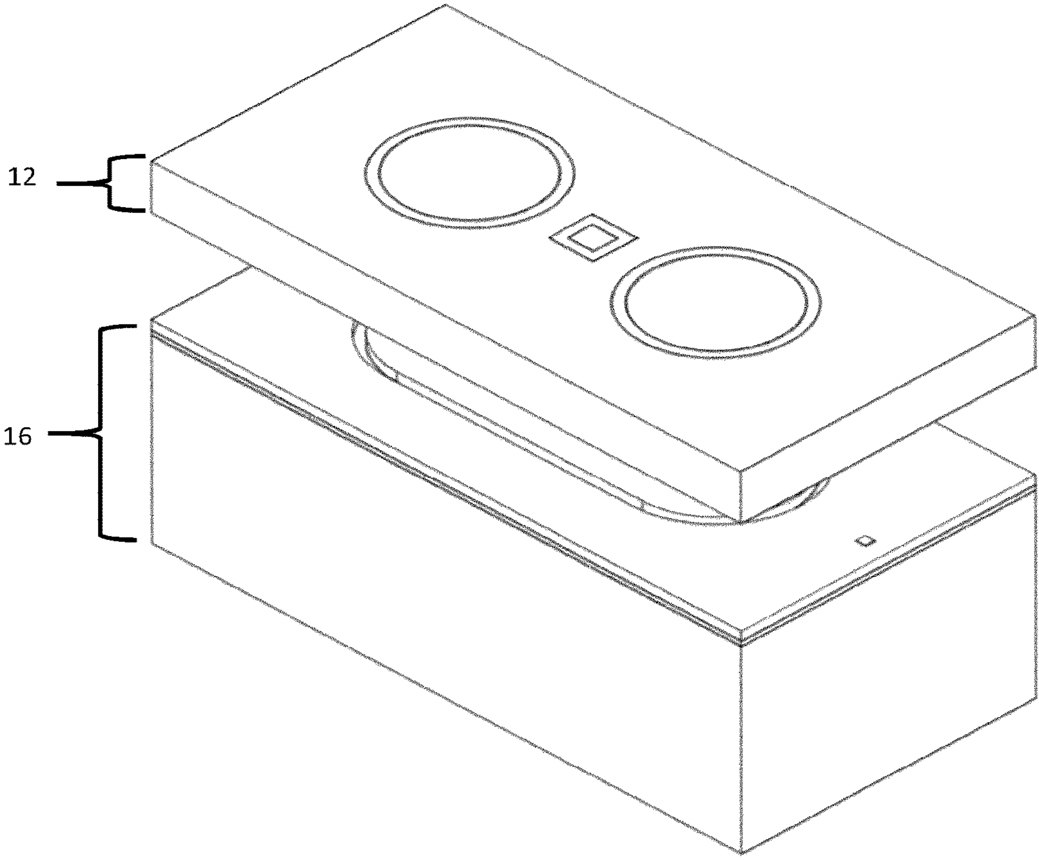
FIG. 18 is a top perspective view of the MEMS layer of FIG. 15, illustrating the alignment of the MEMS wafer to the top cap wafer before bonding.

Referring to FIG. 17 and FIG. 18, the oxide is stripped from the top of the SOI device layer 20 and the top cap silicon wafer 12 is then aligned and bonded to the SOI device layer 20 of the MEMS wafer 16. A wafer bonding method such as fusion bonding, gold thermocompression bonding, or gold-silicon eutectic bonding should be used to provide electrical contact between the wafers 12, 16. In this manner conductive paths can be formed through the handle layer 22, shunts as in 34, and SOI device layer 20 to the top cap wafer 12.

Figure 19:
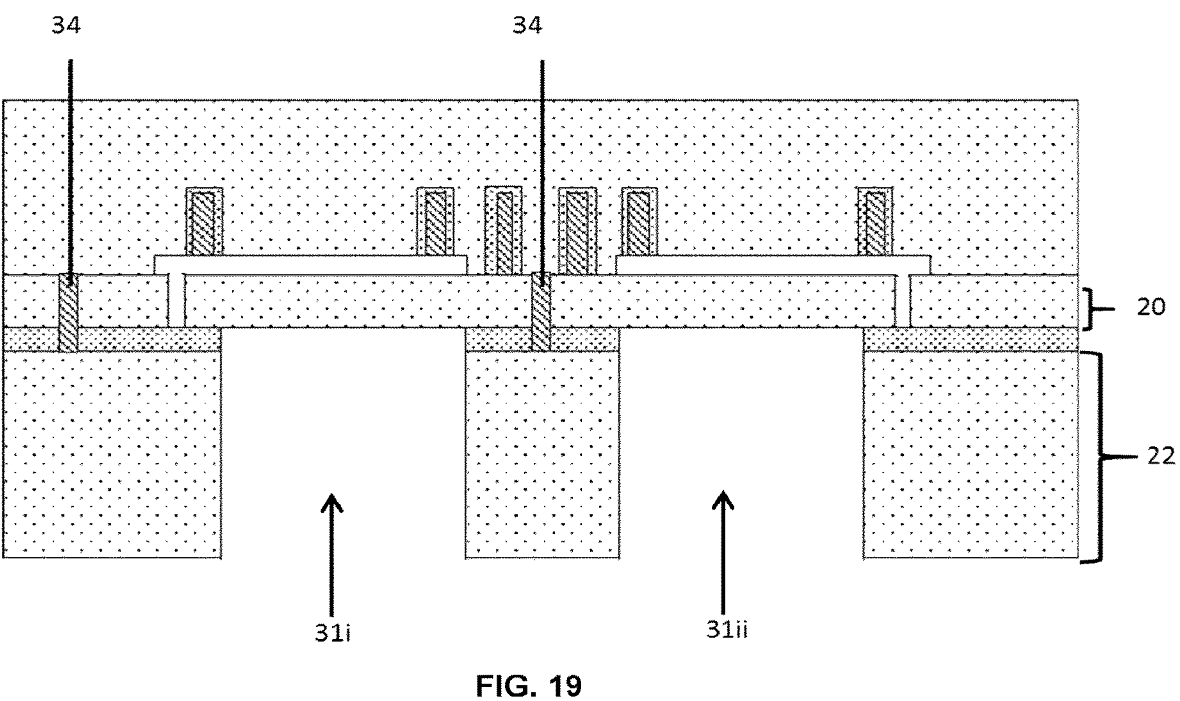
FIG. 19 is a cross-sectional view of the bonded MEMS wafer and top cap wafer of FIG. 17, illustrating the fabricated cavities in the handle layer of the MEMS wafer.
Figure 20:
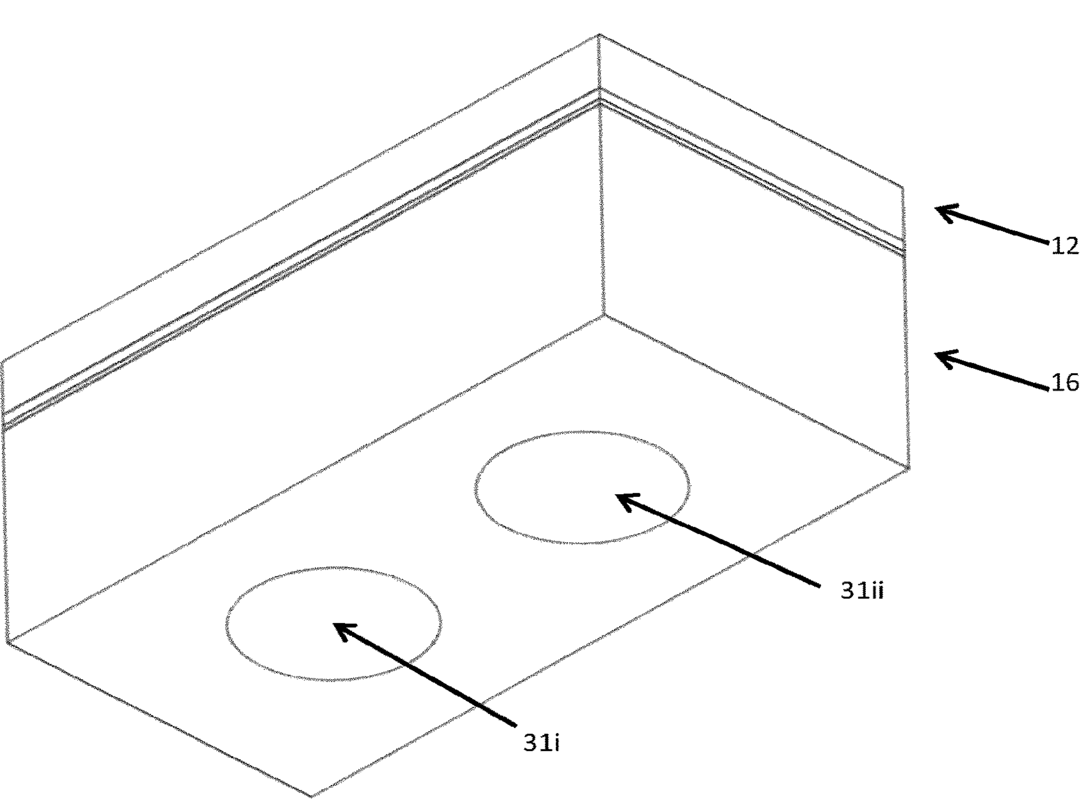
FIG. 20 is a bottom perspective view of the bonded MEMS wafer and top cap wafer of FIG. 19, illustrating the fabricated cavities.

Referring to FIG. 19 and FIG. 20, the SOI handle layer 22 is next patterned with the cavities 31*i*, 31*ii*, delimiting a central feedthroughs. If the feedthrough is attached to an SOI electrical shunt as in 34 on the device layer 20, then it becomes an isolated electrical feedthrough. If the feedthrough is not attached to an SOI shunt as in 34, the feedthrough becomes merely a mechanical support. Of course, in alternate embodiments of the method, the cavities can be patterned prior to bonding the top cap wafer 12 to the central wafer 16. The buried oxide layer 24 is preferably removed from the bottom of the membrane 17, such as by using a wet Hydrofluoric (HF) Acid or anhydrous HF vapor etch. Removing the buried oxide layer provides increased flexibility to the membrane.

Figure 21:
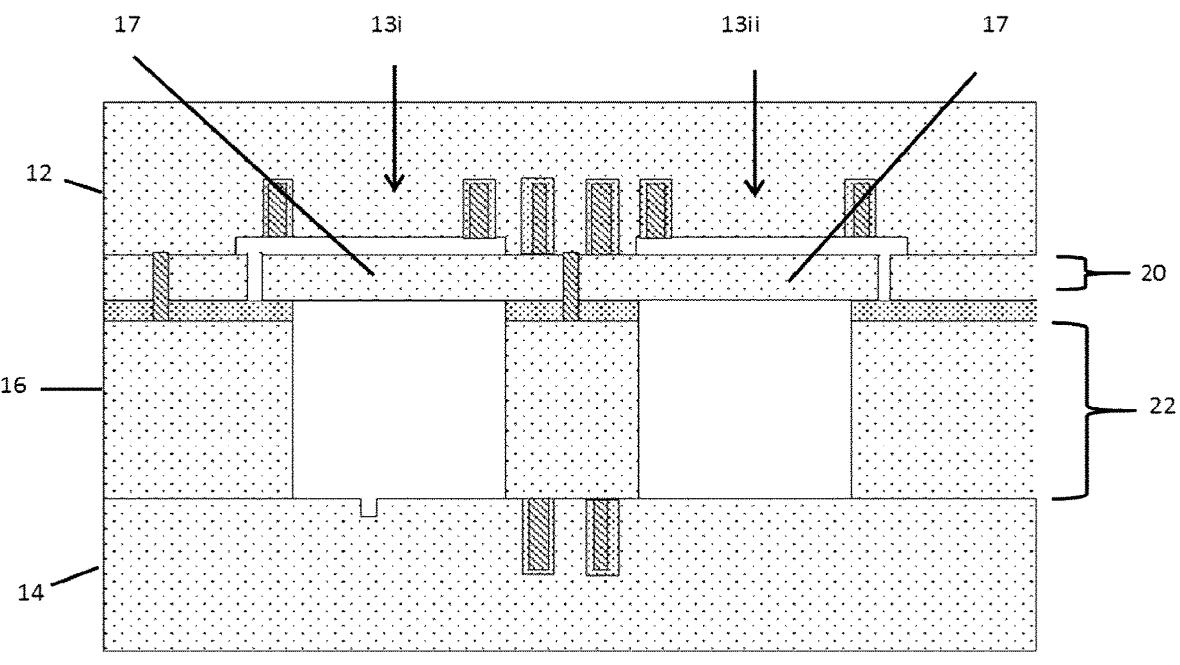
FIG. 21 is a cross-sectional view of the pressure sensor of FIG. 4, illustrating the bonding of the MEMS wafer and top cap wafer of FIG. 19 to the bottom cap layer of FIG. 12.
Figure 22:
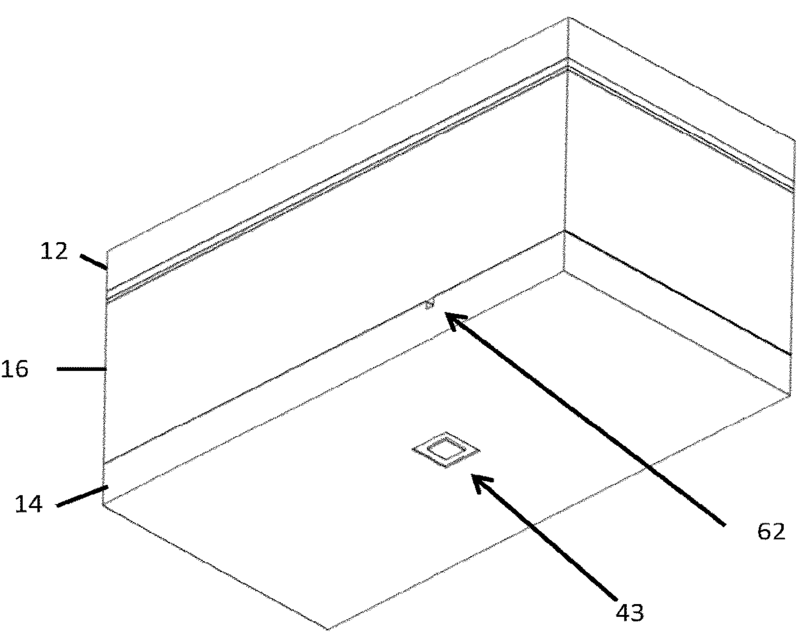
FIG. 22 is a bottom perspective view of the pressure sensor of FIG. 21, illustrating the trenches in the bottom cap layer after grinding.

Referring to FIG. 21 and FIG. 22, the oxide is stripped from the bottom of the MEMS wafer 16 and the bottom cap wafer 14 is bonded to the handle layer 22 of the MEMS wafer 16. The wafer bonding process used should be one that provides a conductive bond such as fusion bonding, gold thermocompression bonding, or gold-silicon eutectic bonding. At this point, the MEMS wafer 16 is hermetically sealed between the top cap wafer 12 and the bottom cap wafer 14 and the membrane 17 is aligned with electrodes 13*i*, 13*ii* of the top cap wafer 12.

Figure 23:
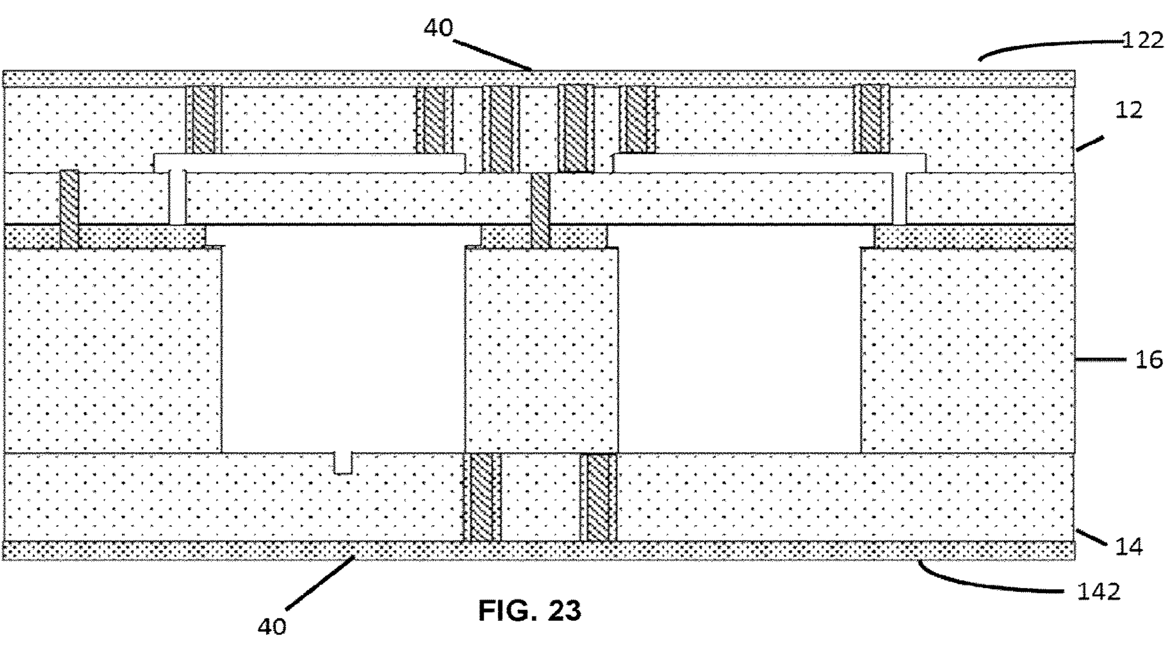
FIG. 23 is a cross-sectional view of the pressure sensor of FIG. 22, illustrating the pressure sensor after grinding, polishing, and passivation.
Figure 24:
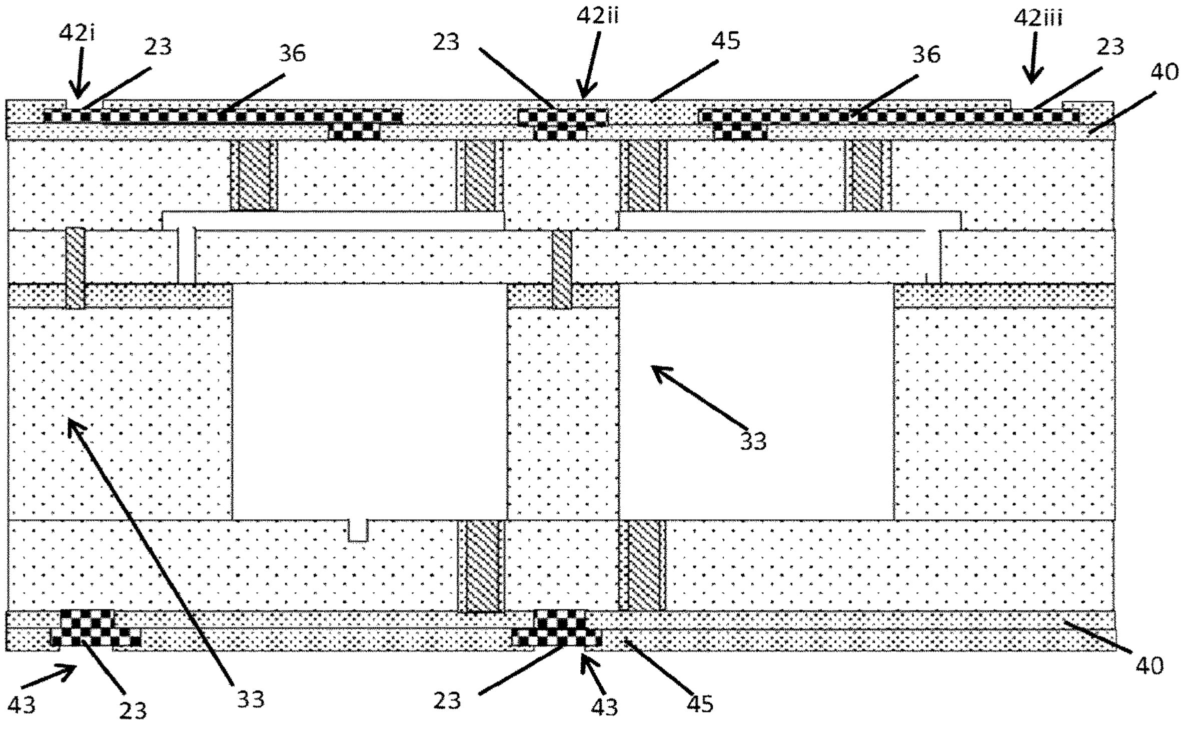
FIG. 24 is a cross-sectional view of the pressure sensor of FIG. 23 illustrating the bond pad contact etch and metallization without an insulating protective oxide layer.
Figure 25:
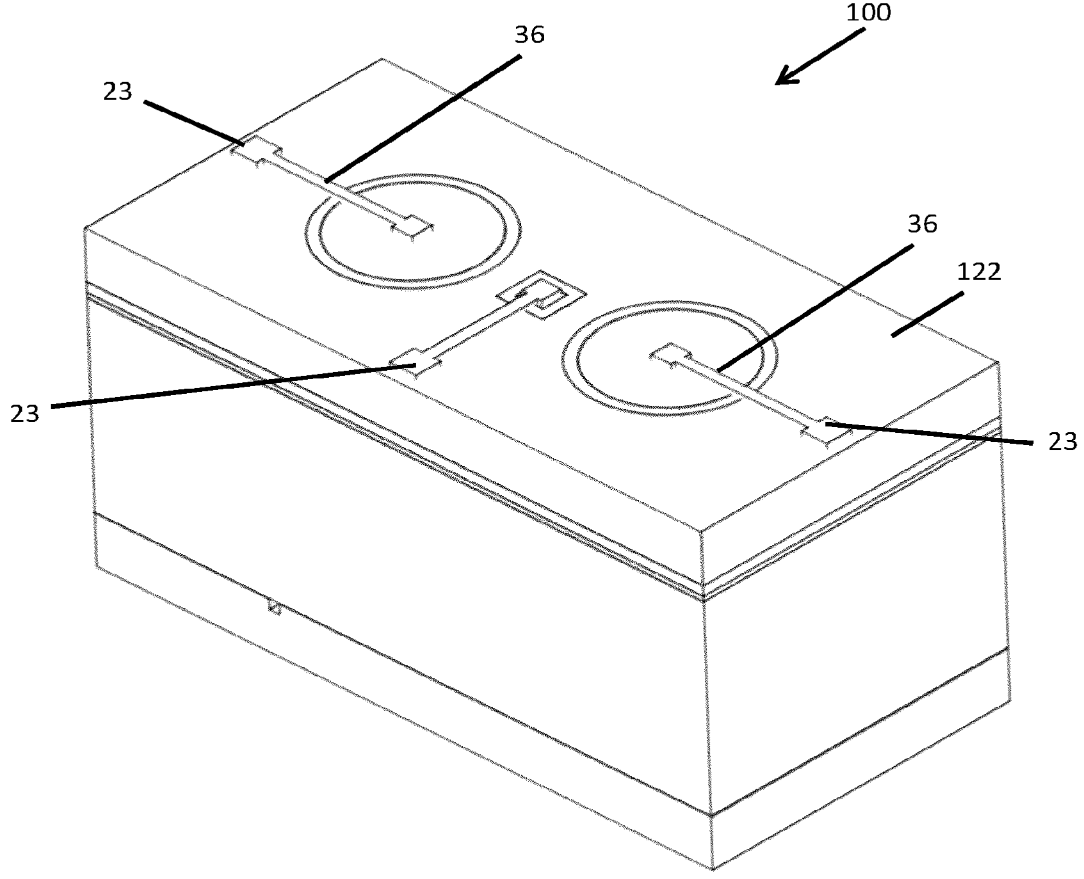
FIG. 25 is a top perspective view of the pressure sensor of FIG. 24 illustrating the bond pad contact etch and metallization without an insulating protective oxide layer.

Referring to FIGS. 23 to 25, since trenches 28 do not yet fully penetrate the caps, the electrodes on the top and bottom cap wafers 12, 14 are shorted together through the excess silicon. Both top and bottom cap wafers 12, 14 are thus grinded and polished to isolate the electrodes and the conducting pathways. Both the top cap wafer 12 and the bottom cap wafer 14 surfaces are passivated with a cap insulating oxide layer 40 to protect them. A metallic layer is applied on the top cap insulating layer 40. The metallic layer is then patterned to form electrical leads 36 and the bond pads 23. Finally, a passivating film 45 is applied over the electrical leads 36 and the bond pad 23. The passivating film 45 protects the electrical leads 36 which can extend along the outer surface 122, 142 of the cap wafers. Openings are then created in the passivating film 45 over the pond pads as in 23 to open the electrical contacts 42*i*, 42*ii*, 42*iii*, 43. In this way, the insulating conducting pathways 33 are formed which extend from the bottom cap wafer 14 through the MEMS wafer 16 to the cap wafer 12 and which are accessible from the top, sides, and bottom of the MEMS pressure sensor 100 from a least the top cap wafer 12 for wire bonding, flip-chip bonding, or wafer bonding. Additional electrical contacts, such as contact 43, may be provided on the bottom cap layer 14 in a similar manner. It should be noted that it is possible to grind the outer sides of both the top and bottom wafers, passivate them, and stop the process at this point, such that the next steps are performed later, in the same or different plants. The described pressure sensor architecture thus provides the packaging flexibility of a 2D chip for 3D MEMS architectures and is compatible with CMOS circuitry.

Figure 26:
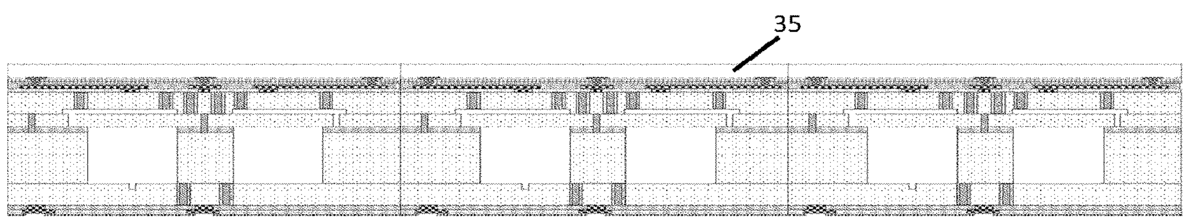
FIG. 26 is a cross-sectional view of a wafer-level assembly including several pressure sensors, wafer level bonded to an Integrated Circuit (IC) wafer, prior to dicing, the MEMS pressure sensors comprising insulating conducting pathways extending from the bottom cap wafer to the top cap wafer, the pathways being electrically connected to the IC wafer.
Figure 27:
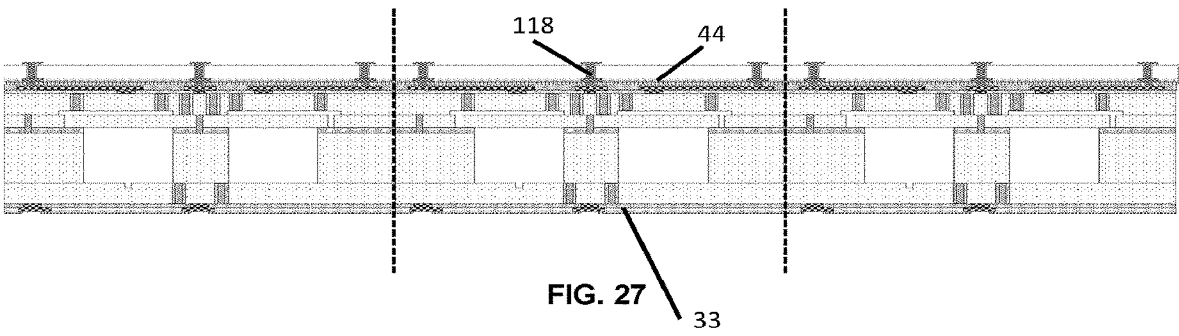
FIG. 27 is a cross-sectional view of the assembly of FIG. 26, prior to dicing, the IC wafer containing TSVs electrically connected to insulated pathways of the MEMS pressure sensors via the electrical contacts of the top cap wafer.

Referring to FIG. 26 and FIG. 27, a portion of patterned and bonded top, central and bottom wafers is shown, including three pressure sensors. At this point, when fabrication of the sealed pressure sensors is complete, integrated circuit (IC) wafer 35 containing sense electronics can be flip-bonded to the top or bottom wafers of the pressure sensors. Thus the MEMS pressure sensors can be electrically connected to the IC wafer 35 without the use of bond wires. With such a configuration, the insulated conducting pathways as in 33 of the pressure sensors can thus be directly connected to TSVs 118 of a CMOS IC wafer 44. The bonded pressure sensors and CMOS wafer 44 can then be diced along the dotted lines, thereby producing hermetically sealed chips.

Figure 29:
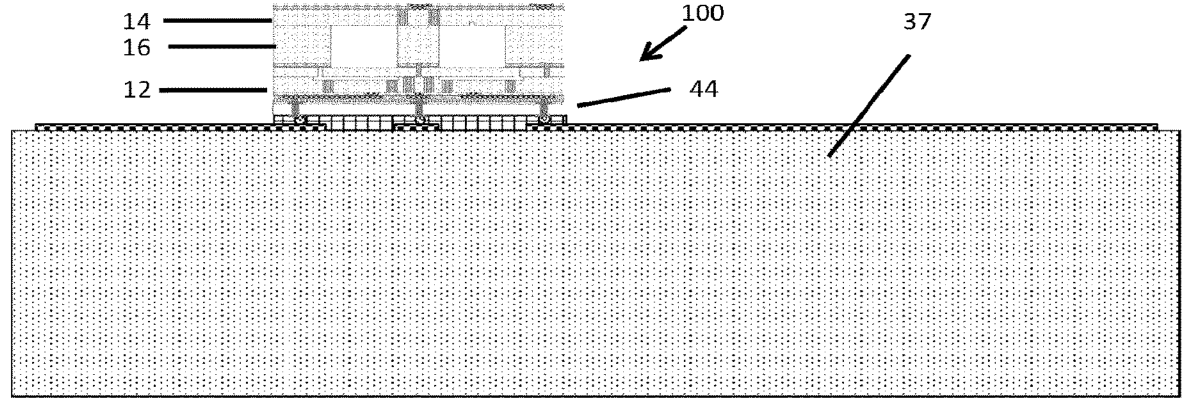
FIG. 29 shows a cross sectional view of the MEMS pressure sensor of FIG. 5, of an IC chip and of a PCB, the IC chip being bonded to the top cap wafer of the MEMS pressure sensor, the IC chip being flip-chip bonded to a PCB without wire bonding, the CMOS IC chip including TSVs allowing to route signals from the PCB to the MEMS pressure sensor.

Referring to FIGS. 28 and 29, when the combined wafers are diced, the individual chips are 3D System (3DS) pressure sensors 100 that can be directly bump bonded to a printed circuit board (PCB) 37 without additional wire-bonding or packaging. The IC chip can be bonded directly to the PCB 37 (as in FIG. 29), or alternatively, the bottom cap wafer can be bonded to the PCB 37, with the IC chip located opposite the PCB (as in FIG. 28).

Figure 30:
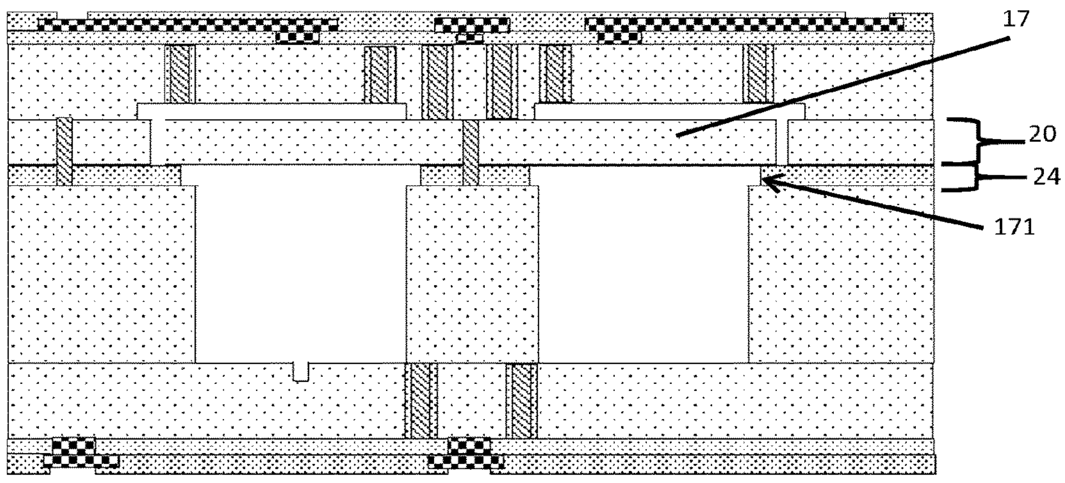
FIG. 30 shows the MEMS pressure sensor of FIG. 5, illustrating the potential hydrofluoric (HF) undercut of the membrane perimeter.
Figure 31:
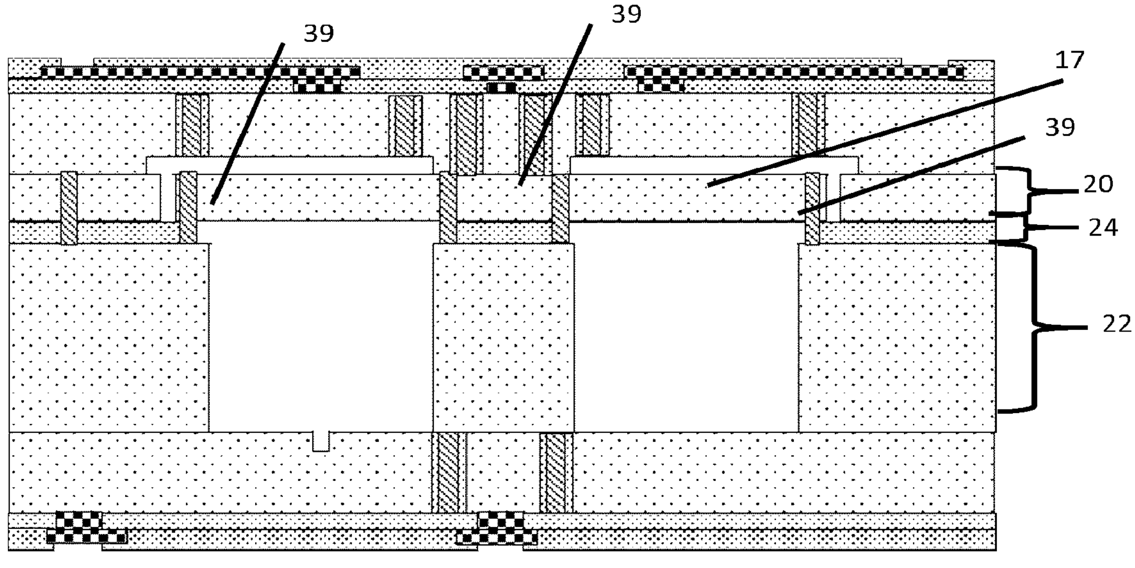
FIG. 31 shows control of the membrane edge of FIG. 30, using a shunt ring, according to an illustrative embodiment of the present invention.

Referring to FIG. 30, a concern that arises during fabrication of the pressure sensor is when the buried oxide layer 24 is removed from the bottom of the membrane 17. The oxide is usually removed using a wet Hydrofluoric (HF) Acid or anhydrous HF vapor etch. Since these HF-based etches are isotropic, the edge 171 of the membrane 17 can be undercut by the etch, making the dimensions of the membrane 17 difficult to control. Since the pressure sensitivity depends on the membrane radius to the $4^{th}$ power, the undercut can lead to variability in the radius and hence the pressure sensitivity.

Referring now to FIG. 30, in addition to FIG. 29, the effect on sensitivity of the HF undercut can be illustratively eliminated by using a guard ring of shunt material 39 to define the perimeter of the membrane 17. The shunt material 39 preferably extends through the device layer 20, the buried oxide layer 24 and the handle layer 22.

The figures illustrate only an exemplary embodiment of the invention and are, therefore, not to be considered limiting of its scope, for the invention may admit to other equally effective embodiments. The scope of the claims should not be limited by the preferred embodiments set forth in the examples, but should be given the broadest interpretation consistent with the description as a whole.

The invention claimed is:

1. A MEMS pressure sensor comprising:

a MEMS electrically conductive silicon wafer having first and second opposite sides, the MEMS electrically conductive silicon wafer having formed therein a frame and a membrane sealed to the frame, the frame defining at least one cavity, the membrane being suspended by the frame relative to said at least one cavity on the second side of the MEMS electrically conductive silicon wafer, the membrane being deflected in response to a change in fluid pressure in the at least one cavity;

an electrically conductive silicon cap wafer having inner and outer sides, the electrically conductive silicon cap wafer being fusion bonded on the inner side to the first side of the MEMS electrically conductive silicon wafer, the inner side of the electrically conductive silicon cap wafer having at least one recess defining, with the membrane, at least one capacitance gap, the electrically conductive silicon cap wafer having formed therein at least one cap electrode located over the membrane and forming, together with the membrane, at least one capacitor to detect a deflection of the membrane and wherein the at least one cap electrode is delimited by a corresponding insulated closed-loop channel patterned in the electrically conductive silicon cap wafer;

at least a first electrical contact and a second electrical contact on the electrically conductive cap wafer, the first electrical contact being connected to the at least one cap electrode and the second electrical contact being connected to the membrane by way of an insulated conducting pathway extending from the MEMS electrically conductive silicon wafer that includes a deflecting portion of the membrane and through the electrically conductive silicon cap wafer;

a vent provided in the electrically conductive silicon cap wafer in fluid communication with the capacitance gap or wherein the vent is in fluid communication with the at least one cavity on the second side of the MEMS electrically conductive silicon wafer.

2. The MEMS pressure sensor according to claim 1, further comprising a second cap silicon wafer having inner and outer sides, the second cap silicon wafer being bonded on its inner side to the second side of the MEMS electrically conductive silicon wafer and enclosing the at least one cavity; at least one conducting shunt extending through an insulating layer in the frame, the at least one conducting shunt forming part of the insulated conducting pathway connecting the membrane to the second electrical contact of the electrically conductive silicon cap wafer.

3. The MEMS pressure sensor according to claim 2, wherein the second cap silicon wafer is electrically conductive.

4. The MEMS pressure sensor according to claim 3, comprising at least one additional electrical contact provided on the outer side of the second cap silicon wafer, connected to one of said first and second electrical contacts on the electrically conductive silicon cap wafer via an insulated feedthrough extending successively through the electrically conductive silicon cap wafer, through the MEMS electrically conductive silicon wafer and through second cap semiconductor wafer.

5. The MEMS pressure sensor according to claim 1, wherein said at least one cavity and said at least one capacitance gap is hermetically sealed under vacuum.

6. The MEMS pressure sensor according to claim 1, wherein the MEMS electrically conductive silicon wafer comprises a silicon-on-insulator (SOI) wafer including a device layer, and insulating layer and a handle layer, the device layer including the membrane having at least one ring of conductive shunt material.

7. The MEMS pressure sensor according to claim 6, wherein the membrane has an outer periphery delimited by a trench etched in the device layer.

8. The MEMS pressure sensor according to claim 7, wherein the outer periphery of the membrane extends beyond the at least one cavity.

9. The MEMS pressure sensor according to claim 6, wherein said MEMS pressure sensor is a differential pressure sensor, and wherein:

in the MEMS SOI wafer, the frame comprises an outer lateral section and an inner section, and said at least one cavity comprises a first cavity and a second cavity, the membrane being suspended over the first and the second cavities by the outer lateral section and by the inner section of the frame;

wherein the electrically conductive silicon cap wafer includes the at least one recess comprising a first recess and a second recess and the at least one capacitance gap comprises a first capacitance gap and a second capacitance gap; and wherein the electrically conductive silicon cap wafer having the least one cap electrode that comprises a first electrode and a second electrode, respectively forming, together with the membrane, a first capacitor and a second capacitor; and wherein the electrically conductive silicon cap wafer comprises a third electrical contact, the first electrical contact being connected to the first electrode and the third electrical contact being connected to the second electrode.

10. The MEMS pressure sensor according to claim 9, wherein the first and the second capacitance gaps and one of the first and second cavities are hermetically sealed under vacuum, the vent extending into the other one of the first and second cavities.

11. The MEMS pressure sensor of claim 6, wherein the electrically conductive silicon cap wafer is conductively bonded to the MEMS SOI wafer.

12. The MEMS pressure sensor of claim 1, wherein the membrane is formed of silicon material.

13. The MEMS pressure sensor of claim 1 further comprising an inertial sensor.

14. The MEMS pressure sensor of claim 13 wherein the inertial sensor comprises an accelerometer.

15. The MEMS pressure sensor of claim 1 wherein the electrically conductive silicon cap wafer further comprises an insulating layer.

16. The MEMS pressure sensor of claim 1 wherein membrane has a change in capacitance in a range of 0.1-1 pF.

17. The MEMS pressure sensor of claim 1 wherein the MEMS pressure sensor comprises a pressure sensor chip bonded to a circuit board and connected to a CMOS integrated circuit.

18. A MEMS pressure sensor comprising:

a MEMS electrically conductive silicon wafer having first and second opposite sides, the MEMS electrically conductive silicon wafer having formed therein a frame and a membrane that separates at least one cavity from a recess with a hermetic seal, the membrane being deflectable in response to a change in fluid pressure on at least one of a first side and a second side of the membrane;

an electrically conductive silicon cap wafer having inner and outer sides, the electrically conductive silicon cap wafer being fusion bonded on the inner side to the first side of the MEMS electrically conductive silicon wafer, the inner side of the electrically conductive silicon cap wafer having the recess defining, with the membrane, at least one capacitance gap, the electrically conductive silicon cap wafer having formed therein at least one cap electrode located relative to the membrane and forming, together with the membrane, at least one capacitor to detect a deflection of the membrane and wherein the at least one cap electrode is defined by an insulated region patterned in the electrically conductive silicon cap wafer;

at least a first electrical contact and a second electrical contact on or over the electrically conductive cap wafer, the first electrical contact being connected to the at least one cap electrode and the second electrical contact being connected to the membrane with an insulated conducting pathway extending through the MEMS conductive silicon wafer and that includes a deflecting portion of the membrane and through a portion of the electrically conductive silicon cap wafer that is electrically insulated from the at least one cap electrode;

a vent in fluid communication with the capacitance gap on the first side of the membrane or in fluid communication with the at least one cavity on the second side of the membrane.

19. The MEMS pressure sensor of claim 18 wherein the electrically conductive silicon cap wafer further comprises an insulating layer.

20. The MEMS pressure sensor of claim 18, further comprising a second cap silicon wafer having inner side and an outer side, the second cap silicon wafer being bonded on the inner side to the second side of the MEMS electrically conductive silicon wafer and enclosing the at least one cavity; at least one conducting shunt extending through an insulating layer in the frame, the at least one conducting shunt forming of the insulated conducting pathway connecting the membrane to the second electrical contact of the electrically conductive silicon cap wafer.

21. The MEMS pressure sensor of claim 18, further comprising a second cap silicon wafer that is electrically conductive.

22. The MEMS pressure sensor of claim 18, wherein the MEMS electrically conductive silicon wafer comprises a silicon-on-insulator (SOI) wafer including a device layer, and insulating layer and a handle layer.

23. The MEMS pressure sensor of claim 22, wherein the membrane has an outer periphery delimited by a trench etched in the device layer.

24. A method of measuring pressure comprising:

measuring pressure with a MEMS pressure sensor comprising:

a MEMS electrically conductive wafer having first and second opposite sides, the MEMS electrically conductive wafer having a frame and a pressure sensor membrane, the frame defining at least one cavity, the pressure sensor membrane suspended by the frame to define a portion of said at least one cavity on the first side of the MEMS electrically conductive wafer;

an electrically conductive cap wafer having an inner side and an outer side, the electrically conductive cap wafer being bonded on the inner side to the first side of the MEMS electrically conductive wafer, the inner side of the electrically conductive cap wafer having at least one recess defining, with the pressure sensor membrane, at least one capacitance gap, the electrically conductive cap wafer having formed therein at least one cap electrode located relative to the pressure sensor membrane and forming, together with the pressure sensor membrane, at least one capacitor to detect a deflection of the pressure sensor membrane;

at least a first electrical contact and a second electrical contact positioned on or over the electrically conductive cap wafer, the first electrical contact being connected to said at least one cap electrode and the second electrical contact being connected to the pressure sensor membrane by an insulated conducting pathway extending from the pressure sensor membrane and through the electrically conductive cap wafer; and a vent extending from outside of the MEMS pressure sensor into one of said at least one cavity and said at least one capacitance gap; and processing pressure sensor signals generated by the MEMS pressure sensor with processing circuitry connected to the electrical contacts.

25. The method of claim 24, wherein the at least one cap electrode is delimited by corresponding insulated closed-loop channel patterned in the electrically conductive cap wafer and extending from the inner to the outer side of the electrically conductive cap wafer, electrically insulating the at least one cap electrode from the remainder of the electrically conductive cap wafer.

26. The method of claim 24, wherein the MEMS electrically conductive wafer comprises a MEMS SOI wafer having a device layer, a handle layer, and an insulating layer, the insulating layer separating the device layer from the handle layer.

27. The method of claim 26, further comprising measuring pressure sensor signals wherein the pressure sensor is hermetically sealed under vacuum in at least one of said at least one cavity and said at least one capacitance gap wherein the pressure sensor membrane has an outer periphery delimited by a trench etched in the device layer.

28. The method of claim 24, comprising conducting signals with at least one additional electrical contact provided on an outer side of a second cap semiconductor wafer and connected to one of said first and second electrical contacts on the electrically conductive cap wafer via an insulated feedthrough extending successively through the electrically conductive cap wafer, through the MEMS SOI wafer and through the second cap semiconductor wafer.

29. The method of claim 24 further comprising processing pressure sensor signals with the processing circuit that comprises an integrated circuit connected to the first electrical contact and the second electrical contact.

30. The method of claim 24 wherein the MEMS pressure sensor comprises a first pressure sensor and a second pressure sensor and further comprising processing pressure sensor signals from the first pressure sensor and the second pressure sensor, the second pressure sensor having a vent.

31. The method of claim 24 further comprising processing pressure sensor signals from the MEMS pressure sensor and processing motion sensor signals from a MEMS motion sensor with the processing circuitry wherein the MEMS pressure sensor and the MEMS motion sensor are mounted on a printed circuit board.

* * * * *